United States Patent
Shalvi et al.

(10) Patent No.: US 8,527,819 B2
(45) Date of Patent: Sep. 3, 2013

(54) DATA STORAGE IN ANALOG MEMORY CELL ARRAYS HAVING ERASE FAILURES

(75) Inventors: Ofir Shalvi, Ra'anana (IL); Shai Winter, Herzliya (IL); Naftali Sommer, Rishon Lezion (IL); Dotan Sokolov, Ra'anana (IL)

(73) Assignee: Apple Inc., Cupertino, CA (US)

( * ) Notice: Subject to any disclaimer, the term of this patent is extended or adjusted under 35 U.S.C. 154(b) by 704 days.

(21) Appl. No.: 12/677,114

(22) PCT Filed: Oct. 12, 2008

(86) PCT No.: PCT/IL2008/001356
§ 371 (c)(1),
(2), (4) Date: Mar. 9, 2010

(87) PCT Pub. No.: WO2009/050703
PCT Pub. Date: Apr. 23, 2009

(65) Prior Publication Data
US 2010/0199150 A1   Aug. 5, 2010

Related U.S. Application Data

(60) Provisional application No. 61/093,366, filed on Sep. 1, 2008, provisional application No. 61/076,647, filed on Jun. 29, 2008, provisional application No. 60/981,117, filed on Oct. 19, 2007.

(51) Int. Cl.
*G11C 29/00* (2006.01)

(52) U.S. Cl.
USPC .......................................... 714/710; 714/711

(58) Field of Classification Search
USPC ................................................. 714/710, 711
See application file for complete search history.

(56) References Cited

U.S. PATENT DOCUMENTS

| | | | |
|---|---|---|---|
| 3,668,631 A | 6/1972 | Griffith et al. | |
| 3,668,632 A | 6/1972 | Oldham | |
| 4,058,851 A | 11/1977 | Scheuneman | |
| 4,112,502 A | 9/1978 | Scheuneman | |
| 4,394,763 A | 7/1983 | Nagano et al. | |
| 4,413,339 A | 11/1983 | Riggle et al. | |
| 4,556,961 A | 12/1985 | Iwahashi et al. | |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Office Action dated Dec. 13, 2011.

(Continued)

*Primary Examiner* — Joshua Lohn
(74) *Attorney, Agent, or Firm* — Meyertons, Hood, Kivlin, Kowert & Goetzel, P.C.

(57) ABSTRACT

A method for data storage includes performing an erasure operation on a group of analog memory cells (32). One or more of the memory cells in the group, which failed the erasure operation, are identified as erase-failed cells. A storage configuration that is used for programming the analog memory cells in the group is modified responsively to the identified erase-failed cells. Data is stored in the group of the analog memory cells using the modified storage configuration.

38 Claims, 6 Drawing Sheets

(56) References Cited

U.S. PATENT DOCUMENTS

| | | |
|---|---|---|
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |
| 5,077,691 A * | 12/1991 | Haddad et al. .......... 365/185.23 |
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotta et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A * | 5/1995 | Shirai .............................. 360/46 |
| 5,416,782 A | 5/1995 | Wells et al. |
| 5,418,752 A * | 5/1995 | Harari et al. .................. 365/218 |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,659,550 A * | 8/1997 | Mehrotra et al. ............. 714/721 |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,742,752 A | 4/1998 | De Koening |
| 5,748,533 A | 5/1998 | Dunlap et al. |
| 5,748,534 A | 5/1998 | Dunlap et al. |
| 5,751,637 A | 5/1998 | Chen et al. |
| 5,761,402 A | 6/1998 | Kaneda et al. |
| 5,798,966 A | 8/1998 | Keeney |
| 5,799,200 A | 8/1998 | Brant et al. |
| 5,801,985 A | 9/1998 | Roohparvar et al. |
| 5,838,832 A | 11/1998 | Barnsley |
| 5,860,106 A | 1/1999 | Domen et al. |
| 5,862,080 A * | 1/1999 | Harari et al. ............. 365/185.29 |
| 5,867,114 A | 2/1999 | Barbir |
| 5,867,428 A | 2/1999 | Ishii et al. |
| 5,867,429 A | 2/1999 | Chen et al. |
| 5,877,986 A | 3/1999 | Harari et al. |
| 5,889,937 A | 3/1999 | Tamagawa |
| 5,901,089 A | 5/1999 | Korsh et al. |
| 5,909,449 A | 6/1999 | So et al. |
| 5,912,906 A | 6/1999 | Wu et al. |
| 5,930,167 A | 7/1999 | Lee et al. |
| 5,937,424 A | 8/1999 | Leak et al. |
| 5,942,004 A | 8/1999 | Cappelletti |
| 5,946,716 A | 8/1999 | Karp et al. |
| 5,969,986 A | 10/1999 | Wong et al. |
| 5,982,668 A | 11/1999 | Ishii et al. |
| 5,991,517 A | 11/1999 | Harari et al. |
| 5,995,417 A | 11/1999 | Chen et al. |
| 6,009,014 A | 12/1999 | Hollmer et al. |
| 6,009,016 A | 12/1999 | Ishii et al. |
| 6,023,425 A | 2/2000 | Ishii et al. |
| 6,034,891 A | 3/2000 | Norman |
| 6,040,993 A | 3/2000 | Chen et al. |
| 6,041,430 A | 3/2000 | Yamauchi |
| 6,073,204 A | 6/2000 | Lakhani et al. |
| 6,101,614 A | 8/2000 | Gonzales et al. |
| 6,128,237 A | 10/2000 | Shirley et al. |
| 6,134,140 A | 10/2000 | Tanaka et al. |
| 6,134,143 A | 10/2000 | Norman |
| 6,134,631 A | 10/2000 | Jennings |
| 6,141,261 A | 10/2000 | Patti |
| 6,151,246 A | 11/2000 | So et al. |
| 6,157,573 A | 12/2000 | Ishii et al. |
| 6,166,962 A | 12/2000 | Chen et al. |
| 6,169,691 B1 | 1/2001 | Pasotti et al. |
| 6,178,466 B1 | 1/2001 | Gilbertson et al. |
| 6,185,134 B1 | 2/2001 | Tanaka et al. |
| 6,209,113 B1 | 3/2001 | Roohparvar |
| 6,212,654 B1 | 4/2001 | Lou et al. |
| 6,219,276 B1 | 4/2001 | Parker |
| 6,219,447 B1 | 4/2001 | Lee et al. |
| 6,222,762 B1 | 4/2001 | Guterman et al. |
| 6,230,233 B1 | 5/2001 | Lofgren et al. |
| 6,240,458 B1 | 5/2001 | Gilbertson |
| 6,259,627 B1 | 7/2001 | Wong |
| 6,275,419 B1 | 8/2001 | Guterman et al. |
| 6,278,632 B1 | 8/2001 | Chevallier |
| 6,279,069 B1 | 8/2001 | Robinson et al. |
| 6,288,944 B1 | 9/2001 | Kawamura |
| 6,292,394 B1 | 9/2001 | Cohen et al. |
| 6,301,151 B1 | 10/2001 | Engh et al. |
| 6,304,486 B1 | 10/2001 | Yano |
| 6,304,488 B1 * | 10/2001 | Abedifard et al. ....... 365/185.23 |
| 6,307,776 B1 | 10/2001 | So et al. |
| 6,314,044 B1 | 11/2001 | Sasaki et al. |
| 6,317,363 B1 | 11/2001 | Guterman et al. |
| 6,317,364 B1 | 11/2001 | Guterman et al. |
| 6,345,004 B1 | 2/2002 | Omura et al. |
| 6,360,346 B1 | 3/2002 | Miyauchi et al. |
| 6,363,008 B1 | 3/2002 | Wong |
| 6,363,454 B1 | 3/2002 | Lakhani et al. |
| 6,366,496 B1 | 4/2002 | Torelli et al. |
| 6,385,092 B1 | 5/2002 | Ishii et al. |
| 6,392,932 B1 | 5/2002 | Ishii et al. |
| 6,396,742 B1 | 5/2002 | Korsh et al. |
| 6,397,364 B1 | 5/2002 | Barkan |
| 6,405,323 B1 | 6/2002 | Lin et al. |
| 6,405,342 B1 | 6/2002 | Lee |
| 6,418,060 B1 | 7/2002 | Yong et al. |
| 6,442,585 B1 | 8/2002 | Dean et al. |
| 6,445,602 B1 | 9/2002 | Kokudo et al. |
| 6,452,838 B1 | 9/2002 | Ishii et al. |
| 6,456,528 B1 | 9/2002 | Chen |
| 6,466,476 B1 | 10/2002 | Wong et al. |
| 6,467,062 B1 | 10/2002 | Barkan |
| 6,469,931 B1 | 10/2002 | Ban et al. |
| 6,480,948 B1 | 11/2002 | Virajpet et al. |
| 6,490,236 B1 | 12/2002 | Fukuda et al. |
| 6,522,580 B2 | 2/2003 | Chen et al. |
| 6,525,952 B2 | 2/2003 | Araki et al. |
| 6,532,181 B2 * | 3/2003 | Saito et al. ...................... 365/200 |
| 6,532,556 B1 | 3/2003 | Wong et al. |
| 6,538,922 B1 | 3/2003 | Khalid et al. |
| 6,549,464 B2 | 4/2003 | Tanaka et al. |
| 6,553,510 B1 * | 4/2003 | Pekny .......................... 714/6.12 |
| 6,558,967 B1 | 5/2003 | Wong |
| 6,560,152 B1 | 5/2003 | Cernea |
| 6,567,311 B2 | 5/2003 | Ishii et al. |
| 6,577,539 B2 | 6/2003 | Iwahashi |
| 6,584,012 B2 | 6/2003 | Banks |
| 6,615,307 B1 | 9/2003 | Roohparvar |
| 6,621,739 B2 | 9/2003 | Gonzales et al. |
| 6,640,326 B1 | 10/2003 | Buckingham et al. |
| 6,643,169 B2 | 11/2003 | Rudelic et al. |
| 6,646,913 B2 | 11/2003 | Micheloni et al. |
| 6,678,192 B2 | 1/2004 | Gongwer et al. |
| 6,683,811 B2 | 1/2004 | Ishii et al. |

| | | | |
|---|---|---|---|
| 6,687,155 B2 | 2/2004 | Nagasue | |
| 6,707,748 B2 | 3/2004 | Lin et al. | |
| 6,708,257 B2 | 3/2004 | Bao | |
| 6,714,449 B2 | 3/2004 | Khalid | |
| 6,717,847 B2 | 4/2004 | Chen | |
| 6,731,557 B2 | 5/2004 | Beretta | |
| 6,732,250 B2 | 5/2004 | Durrant | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,804,805 B2 | 10/2004 | Rub | |
| 6,807,095 B2 | 10/2004 | Chen et al. | |
| 6,807,101 B2 | 10/2004 | Ooishi et al. | |
| 6,809,964 B2 | 10/2004 | Moschopoulos et al. | |
| 6,819,592 B2 | 11/2004 | Noguchi et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,851,081 B2 | 2/2005 | Yamamoto | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,870,773 B2 | 3/2005 | Noguchi et al. | |
| 6,873,552 B2 | 3/2005 | Ishii et al. | |
| 6,879,520 B2 | 4/2005 | Hosono et al. | |
| 6,882,567 B1 | 4/2005 | Wong | |
| 6,894,926 B2 | 5/2005 | Guterman et al. | |
| 6,907,497 B2 * | 6/2005 | Hosono et al. | 711/103 |
| 6,914,846 B2 * | 7/2005 | Harari et al. | 365/230.03 |
| 6,925,009 B2 | 8/2005 | Noguchi et al. | |
| 6,930,925 B2 | 8/2005 | Guo et al. | |
| 6,934,188 B2 | 8/2005 | Roohparvar | |
| 6,937,511 B2 | 8/2005 | Hsu et al. | |
| 6,958,938 B2 | 10/2005 | Noguchi et al. | |
| 6,963,505 B2 | 11/2005 | Cohen | |
| 6,972,993 B2 * | 12/2005 | Conley et al. | 365/185.04 |
| 6,988,175 B2 | 1/2006 | Lasser | |
| 6,992,932 B2 | 1/2006 | Cohen | |
| 6,999,344 B2 | 2/2006 | Hosono et al. | |
| 7,002,843 B2 | 2/2006 | Guterman et al. | |
| 7,006,379 B2 | 2/2006 | Noguchi et al. | |
| 7,012,835 B2 | 3/2006 | Gonzales et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,039,846 B2 | 5/2006 | Hewitt et al. | |
| 7,042,766 B1 | 5/2006 | Wang et al. | |
| 7,054,193 B1 | 5/2006 | Wong | |
| 7,054,199 B2 | 5/2006 | Lee et al. | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,071,849 B2 | 7/2006 | Zhang | |
| 7,072,222 B2 | 7/2006 | Ishii et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,145,805 B2 | 12/2006 | Ishii et al. | |
| 7,151,692 B2 | 12/2006 | Wu | |
| 7,154,803 B2 * | 12/2006 | Martinelli et al. | 365/227 |
| 7,158,058 B1 | 1/2007 | Yu | |
| 7,170,781 B2 | 1/2007 | So et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,184,319 B2 * | 2/2007 | Micheloni et al. | 365/185.29 |
| 7,184,338 B2 | 2/2007 | Nagakawa et al. | |
| 7,187,195 B2 | 3/2007 | Kim | |
| 7,187,592 B2 | 3/2007 | Guterman et al. | |
| 7,190,614 B2 | 3/2007 | Wu | |
| 7,193,898 B2 | 3/2007 | Cernea | |
| 7,193,921 B2 | 3/2007 | Choi et al. | |
| 7,196,644 B1 | 3/2007 | Anderson et al. | |
| 7,196,928 B2 | 3/2007 | Chen | |
| 7,196,933 B2 | 3/2007 | Shibata | |
| 7,197,594 B2 | 3/2007 | Raz et al. | |
| 7,200,062 B2 | 4/2007 | Kinsely et al. | |
| 7,210,077 B2 | 4/2007 | Brandenberger et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,231,562 B2 | 6/2007 | Ohlhoff et al. | |
| 7,243,275 B2 | 7/2007 | Gongwer et al. | |
| 7,254,690 B2 | 8/2007 | Rao | |
| 7,254,763 B2 | 8/2007 | Aadsen et al. | |
| 7,257,027 B2 | 8/2007 | Park | |
| 7,259,987 B2 | 8/2007 | Chen et al. | |
| 7,266,026 B2 | 9/2007 | Gongwer et al. | |
| 7,266,069 B2 | 9/2007 | Chu | |
| 7,269,066 B2 | 9/2007 | Nguyen et al. | |
| 7,272,757 B2 | 9/2007 | Stocken | |
| 7,274,611 B2 | 9/2007 | Roohparvar | |
| 7,277,355 B2 | 10/2007 | Tanzana | |
| 7,280,398 B1 | 10/2007 | Lee et al. | |
| 7,280,409 B2 | 10/2007 | Misumi et al. | |
| 7,280,415 B2 | 10/2007 | Hwang et al. | |
| 7,283,399 B2 | 10/2007 | Ishii et al. | |
| 7,289,344 B2 | 10/2007 | Chen | |
| 7,301,807 B2 | 11/2007 | Khalid et al. | |
| 7,301,817 B2 | 11/2007 | Li et al. | |
| 7,308,525 B2 | 12/2007 | Lasser et al. | |
| 7,310,255 B2 * | 12/2007 | Chan | 365/22 |
| 7,310,269 B2 | 12/2007 | Shibata | |
| 7,310,271 B2 | 12/2007 | Lee | |
| 7,310,272 B1 | 12/2007 | Mokhesi et al. | |
| 7,310,347 B2 | 12/2007 | Lasser | |
| 7,312,727 B1 | 12/2007 | Feng et al. | |
| 7,321,509 B2 | 1/2008 | Chen et al. | |
| 7,328,384 B1 | 2/2008 | Kulkarni et al. | |
| 7,342,831 B2 | 3/2008 | Mokhlesi et al. | |
| 7,343,330 B1 | 3/2008 | Boesjes et al. | |
| 7,345,924 B2 | 3/2008 | Nguyen et al. | |
| 7,345,928 B2 | 3/2008 | Li | |
| 7,349,263 B2 | 3/2008 | Kim et al. | |
| 7,356,755 B2 | 4/2008 | Fackenthal | |
| 7,363,420 B2 | 4/2008 | Lin et al. | |
| 7,365,671 B1 | 4/2008 | Anderson | |
| 7,388,781 B2 | 6/2008 | Litsyn et al. | |
| 7,397,697 B2 | 7/2008 | So et al. | |
| 7,405,974 B2 | 7/2008 | Yaoi et al. | |
| 7,405,979 B2 | 7/2008 | Ishii et al. | |
| 7,408,804 B2 | 8/2008 | Hemink et al. | |
| 7,408,810 B2 | 8/2008 | Aritome et al. | |
| 7,409,473 B2 | 8/2008 | Conley et al. | |
| 7,409,623 B2 | 8/2008 | Baker et al. | |
| 7,420,847 B2 | 9/2008 | Li | |
| 7,433,231 B2 | 10/2008 | Aritome | |
| 7,433,697 B2 | 10/2008 | Karaoguz et al. | |
| 7,434,111 B2 | 10/2008 | Sugiura et al. | |
| 7,437,498 B2 | 10/2008 | Ronen | |
| 7,440,324 B2 | 10/2008 | Mokhlesi | |
| 7,440,331 B2 | 10/2008 | Hemink | |
| 7,441,067 B2 | 10/2008 | Gorobetz et al. | |
| 7,447,970 B2 | 11/2008 | Wu et al. | |
| 7,450,421 B2 | 11/2008 | Mokhlesi et al. | |
| 7,453,737 B2 | 11/2008 | Ha | |
| 7,457,163 B2 | 11/2008 | Hemink | |
| 7,457,897 B1 | 11/2008 | Lee et al. | |
| 7,460,410 B2 | 12/2008 | Nagai et al. | |
| 7,460,412 B2 | 12/2008 | Lee et al. | |
| 7,466,592 B2 | 12/2008 | Mitani et al. | |
| 7,468,907 B2 | 12/2008 | Kang et al. | |
| 7,468,911 B2 | 12/2008 | Lutze et al. | |
| 7,469,049 B1 | 12/2008 | Feng | |
| 7,471,581 B2 | 12/2008 | Tran et al. | |
| 7,483,319 B2 | 1/2009 | Brown | |

| | | |
|---|---|---|
| 7,487,329 B2 | 2/2009 | Hepkin et al. |
| 7,487,394 B2 | 2/2009 | Forhan et al. |
| 7,492,641 B2 | 2/2009 | Hosono et al. |
| 7,508,710 B2 | 3/2009 | Mokhlesi |
| 7,526,711 B2 | 4/2009 | Orio |
| 7,539,061 B2 | 5/2009 | Lee |
| 7,539,062 B2 | 5/2009 | Doyle |
| 7,551,492 B2 | 6/2009 | Kim |
| 7,558,109 B2 | 7/2009 | Brandman et al. |
| 7,558,839 B1 | 7/2009 | McGovern |
| 7,568,135 B2 | 7/2009 | Cornwell et al. |
| 7,570,520 B2 | 8/2009 | Kamei et al. |
| 7,574,555 B2 | 8/2009 | Porat et al. |
| 7,590,002 B2 | 9/2009 | Mokhlesi et al. |
| 7,593,259 B2 | 9/2009 | Kim |
| 7,594,093 B1 | 9/2009 | Kancherla |
| 7,596,707 B1 | 9/2009 | Vemula |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,619,918 B2 | 11/2009 | Aritome |
| 7,631,245 B2 | 12/2009 | Lasser |
| 7,633,798 B2 | 12/2009 | Sarin et al. |
| 7,633,802 B2 | 12/2009 | Mokhlesi |
| 7,639,532 B2 | 12/2009 | Roohparvar et al. |
| 7,644,347 B2 | 1/2010 | Alexander et al. |
| 7,656,734 B2 | 2/2010 | Thorp et al. |
| 7,660,158 B2 | 2/2010 | Aritome |
| 7,660,183 B2 | 2/2010 | Ware et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,680,987 B1 | 3/2010 | Clark et al. |
| 7,733,712 B1 | 6/2010 | Walston et al. |
| 7,742,351 B2 | 6/2010 | Inoue et al. |
| 7,761,624 B2 | 7/2010 | Karamcheti et al. |
| 7,797,609 B2 | 9/2010 | Neuman |
| 7,810,017 B2 | 10/2010 | Radke |
| 7,848,149 B2 | 12/2010 | Gonzales et al. |
| 7,869,273 B2 | 1/2011 | Lee et al. |
| 7,885,119 B2 | 2/2011 | Li |
| 7,904,783 B2 | 3/2011 | Brandman et al. |
| 7,928,497 B2 | 4/2011 | Yaegashi |
| 7,929,549 B1 | 4/2011 | Talbot |
| 7,930,515 B2 | 4/2011 | Gupta et al. |
| 7,945,825 B2 | 5/2011 | Cohen et al. |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 2001/0002172 A1 | 5/2001 | Tanaka et al. |
| 2001/0006479 A1 | 7/2001 | Ikehashi et al. |
| 2002/0038440 A1 | 3/2002 | Barkan |
| 2002/0056064 A1 | 5/2002 | Kidorf et al. |
| 2002/0118574 A1 | 8/2002 | Gongwer et al. |
| 2002/0133684 A1 | 9/2002 | Anderson |
| 2002/0166091 A1 | 11/2002 | Kidorf et al. |
| 2002/0174295 A1 | 11/2002 | Ulrich et al. |
| 2002/0196510 A1 | 12/2002 | Hietala et al. |
| 2003/0002348 A1 | 1/2003 | Chen et al. |
| 2003/0103400 A1 | 6/2003 | Van Tran |
| 2003/0161183 A1 | 8/2003 | Van Tran |
| 2003/0174555 A1* | 9/2003 | Conley et al. ................. 365/200 |
| 2003/0189856 A1 | 10/2003 | Cho et al. |
| 2004/0057265 A1 | 3/2004 | Mirabel et al. |
| 2004/0057285 A1 | 3/2004 | Cernea et al. |
| 2004/0083333 A1 | 4/2004 | Chang et al. |
| 2004/0083334 A1 | 4/2004 | Chang et al. |
| 2004/0105311 A1 | 6/2004 | Cernea et al. |
| 2004/0114437 A1 | 6/2004 | Li |
| 2004/0160842 A1 | 8/2004 | Fukiage |
| 2004/0223371 A1 | 11/2004 | Roohparvar |
| 2004/0223399 A1* | 11/2004 | Campardo et al. ............ 365/232 |
| 2005/0007802 A1 | 1/2005 | Gerpheide |
| 2005/0013165 A1 | 1/2005 | Ban |
| 2005/0024941 A1 | 2/2005 | Lasser et al. |
| 2005/0024978 A1 | 2/2005 | Ronen |
| 2005/0030788 A1 | 2/2005 | Parkinson et al. |
| 2005/0086574 A1 | 4/2005 | Fackenthal |
| 2005/0121436 A1 | 6/2005 | Kamitani et al. |
| 2005/0144361 A1 | 6/2005 | Gonzalez et al. |
| 2005/0157555 A1 | 7/2005 | Ono et al. |
| 2005/0162913 A1 | 7/2005 | Chen |
| 2005/0169051 A1 | 8/2005 | Khalid et al. |
| 2005/0189649 A1 | 9/2005 | Maruyama et al. |
| 2005/0213393 A1 | 9/2005 | Lasser |
| 2005/0224853 A1 | 10/2005 | Ohkawa |
| 2005/0240745 A1 | 10/2005 | Iyer et al. |
| 2005/0243626 A1 | 11/2005 | Ronen |
| 2006/0004952 A1 | 1/2006 | Lasser |
| 2006/0028875 A1 | 2/2006 | Avraham et al. |
| 2006/0028877 A1 | 2/2006 | Meir |
| 2006/0101193 A1 | 5/2006 | Murin |
| 2006/0106972 A1 | 5/2006 | Gorobets et al. |
| 2006/0107136 A1 | 5/2006 | Gongwer et al. |
| 2006/0129750 A1 | 6/2006 | Lee et al. |
| 2006/0133141 A1 | 6/2006 | Gorobets |
| 2006/0156189 A1 | 7/2006 | Tomlin |
| 2006/0179334 A1 | 8/2006 | Brittain et al. |
| 2006/0190699 A1 | 8/2006 | Lee |
| 2006/0203546 A1 | 9/2006 | Lasser |
| 2006/0218359 A1 | 9/2006 | Sanders et al. |
| 2006/0221692 A1 | 10/2006 | Chen |
| 2006/0221705 A1* | 10/2006 | Hemink et al. ............ 365/185.28 |
| 2006/0221714 A1 | 10/2006 | Li et al. |
| 2006/0239077 A1 | 10/2006 | Park et al. |
| 2006/0239081 A1 | 10/2006 | Roohparvar |
| 2006/0256620 A1 | 11/2006 | Nguyen et al. |
| 2006/0256626 A1 | 11/2006 | Werner et al. |
| 2006/0256891 A1 | 11/2006 | Yuan et al. |
| 2006/0271748 A1 | 11/2006 | Jain et al. |
| 2006/0285392 A1 | 12/2006 | Incarnati et al. |
| 2006/0285396 A1 | 12/2006 | Ha |
| 2007/0006013 A1 | 1/2007 | Moshayedi et al. |
| 2007/0019481 A1 | 1/2007 | Park |
| 2007/0033581 A1 | 2/2007 | Tomlin et al. |
| 2007/0047314 A1 | 3/2007 | Goda et al. |
| 2007/0047326 A1 | 3/2007 | Nguyen et al. |
| 2007/0050536 A1 | 3/2007 | Kolokowsky |
| 2007/0058446 A1 | 3/2007 | Hwang et al. |
| 2007/0061502 A1 | 3/2007 | Lasser et al. |
| 2007/0067667 A1 | 3/2007 | Ikeuchi et al. |
| 2007/0074093 A1 | 3/2007 | Lasser |
| 2007/0086239 A1 | 4/2007 | Litsyn et al. |
| 2007/0086260 A1 | 4/2007 | Sinclair |
| 2007/0089034 A1 | 4/2007 | Litsyn et al. |
| 2007/0091677 A1* | 4/2007 | Lasser et al. ............. 365/185.09 |
| 2007/0091694 A1 | 4/2007 | Lee et al. |
| 2007/0103978 A1 | 5/2007 | Conley et al. |
| 2007/0103986 A1 | 5/2007 | Chen |
| 2007/0104211 A1 | 5/2007 | Opsasnick |
| 2007/0104845 A1 | 5/2007 | Chen |
| 2007/0109849 A1 | 5/2007 | Chen |
| 2007/0115726 A1 | 5/2007 | Cohen et al. |
| 2007/0118713 A1 | 5/2007 | Guterman et al. |
| 2007/0143378 A1 | 6/2007 | Gorobetz |
| 2007/0143531 A1 | 6/2007 | Atri |
| 2007/0159889 A1 | 7/2007 | Kang et al. |
| 2007/0159892 A1 | 7/2007 | Kang et al. |
| 2007/0159907 A1 | 7/2007 | Kwak |
| 2007/0168837 A1 | 7/2007 | Murin |
| 2007/0171714 A1 | 7/2007 | Wu et al. |
| 2007/0183210 A1 | 8/2007 | Choi et al. |
| 2007/0189073 A1 | 8/2007 | Aritome |
| 2007/0195602 A1 | 8/2007 | Fong et al. |
| 2007/0206426 A1 | 9/2007 | Mokhlesi |
| 2007/0208904 A1 | 9/2007 | Hsieh et al. |
| 2007/0226599 A1 | 9/2007 | Motwani |
| 2007/0236990 A1 | 10/2007 | Aritome |
| 2007/0253249 A1 | 11/2007 | Kang et al. |
| 2007/0256620 A1 | 11/2007 | Viggiano et al. |
| 2007/0263455 A1 | 11/2007 | Cornwell et al. |
| 2007/0266232 A1 | 11/2007 | Rodgers et al. |
| 2007/0271424 A1 | 11/2007 | Lee et al. |
| 2007/0280000 A1 | 12/2007 | Fujiu et al. |
| 2007/0291571 A1 | 12/2007 | Balasundaram |
| 2007/0297234 A1 | 12/2007 | Cernea et al. |

| | | |
|---|---|---|
| 2008/0010395 A1 | 1/2008 | Mylly et al. |
| 2008/0025121 A1 | 1/2008 | Tanzawa |
| 2008/0043535 A1 | 2/2008 | Roohparvar |
| 2008/0049504 A1 | 2/2008 | Kasahara et al. |
| 2008/0049506 A1 | 2/2008 | Guterman |
| 2008/0052446 A1 | 2/2008 | Lasser et al. |
| 2008/0055993 A1 | 3/2008 | Lee |
| 2008/0080243 A1 | 4/2008 | Edahiro et al. |
| 2008/0082730 A1 | 4/2008 | Kim et al. |
| 2008/0089123 A1 | 4/2008 | Chae et al. |
| 2008/0104309 A1 | 5/2008 | Cheon et al. |
| 2008/0104312 A1 | 5/2008 | Lasser |
| 2008/0109590 A1 | 5/2008 | Jung et al. |
| 2008/0115017 A1 | 5/2008 | Jacobson |
| 2008/0123420 A1 | 5/2008 | Brandman et al. |
| 2008/0123426 A1 | 5/2008 | Lutze et al. |
| 2008/0126686 A1 | 5/2008 | Sokolov et al. |
| 2008/0130341 A1 | 6/2008 | Shalvi et al. |
| 2008/0148115 A1 | 6/2008 | Sokolov et al. |
| 2008/0151618 A1 | 6/2008 | Sharon et al. |
| 2008/0151667 A1 | 6/2008 | Miu et al. |
| 2008/0158958 A1 | 7/2008 | Sokolov et al. |
| 2008/0181001 A1 | 7/2008 | Shalvi |
| 2008/0198650 A1 | 8/2008 | Shalvi et al. |
| 2008/0198654 A1 | 8/2008 | Toda |
| 2008/0209116 A1 | 8/2008 | Caulkins |
| 2008/0209304 A1 | 8/2008 | Winarski et al. |
| 2008/0215798 A1 | 9/2008 | Sharon et al. |
| 2008/0219050 A1 | 9/2008 | Shalvi et al. |
| 2008/0239093 A1 | 10/2008 | Easwar et al. |
| 2008/0239812 A1 | 10/2008 | Abiko et al. |
| 2008/0253188 A1 | 10/2008 | Aritome |
| 2008/0263262 A1 | 10/2008 | Sokolov et al. |
| 2008/0263676 A1 | 10/2008 | Mo et al. |
| 2008/0270730 A1 | 10/2008 | Lasser et al. |
| 2008/0282106 A1 | 11/2008 | Shalvi et al. |
| 2008/0288714 A1 | 11/2008 | Salomon et al. |
| 2009/0013233 A1 | 1/2009 | Radke |
| 2009/0024904 A1* | 1/2009 | Roohparvar et al. ......... 714/773 |
| 2009/0024905 A1 | 1/2009 | Shalvi et al. |
| 2009/0034337 A1 | 2/2009 | Aritome |
| 2009/0043831 A1 | 2/2009 | Antonopoulos et al. |
| 2009/0043951 A1 | 2/2009 | Shalvi et al. |
| 2009/0049234 A1 | 2/2009 | Oh et al. |
| 2009/0073762 A1 | 3/2009 | Lee et al. |
| 2009/0086542 A1 | 4/2009 | Lee et al. |
| 2009/0089484 A1 | 4/2009 | Chu |
| 2009/0091979 A1 | 4/2009 | Shalvi |
| 2009/0094930 A1 | 4/2009 | Schwoerer |
| 2009/0106485 A1 | 4/2009 | Anholt |
| 2009/0112949 A1 | 4/2009 | Ergan et al. |
| 2009/0132755 A1 | 5/2009 | Radke |
| 2009/0144600 A1 | 6/2009 | Perlmutter et al. |
| 2009/0150894 A1 | 6/2009 | Huang et al. |
| 2009/0157950 A1 | 6/2009 | Selinger |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0172257 A1 | 7/2009 | Prins et al. |
| 2009/0172261 A1 | 7/2009 | Prins et al. |
| 2009/0193184 A1 | 7/2009 | Yu et al. |
| 2009/0199074 A1 | 8/2009 | Sommer et al. |
| 2009/0204824 A1 | 8/2009 | Lin et al. |
| 2009/0204872 A1 | 8/2009 | Yu et al. |
| 2009/0213653 A1 | 8/2009 | Perlmutter et al. |
| 2009/0213654 A1 | 8/2009 | Perlmutter et al. |
| 2009/0225595 A1 | 9/2009 | Kim |
| 2009/0228761 A1 | 9/2009 | Perlmutter et al. |
| 2009/0240872 A1 | 9/2009 | Perlmutter et al. |
| 2009/0265509 A1 | 10/2009 | Klein |
| 2009/0300227 A1 | 12/2009 | Nochimowski et al. |
| 2009/0323412 A1 | 12/2009 | Mokhlesi et al. |
| 2009/0327608 A1 | 12/2009 | Eschmann |
| 2010/0017650 A1 | 1/2010 | Chin et al. |
| 2010/0034022 A1 | 2/2010 | Dutta et al. |
| 2010/0057976 A1 | 3/2010 | Lasser |
| 2010/0061151 A1 | 3/2010 | Miwa et al. |
| 2010/0082883 A1 | 4/2010 | Chen et al. |
| 2010/0083247 A1 | 4/2010 | Kanevsky et al. |
| 2010/0110580 A1 | 5/2010 | Takashima |
| 2010/0131697 A1 | 5/2010 | Alrod et al. |
| 2010/0142268 A1 | 6/2010 | Aritome |
| 2010/0142277 A1 | 6/2010 | Yang et al. |
| 2010/0169547 A1 | 7/2010 | Ou |
| 2010/0169743 A1 | 7/2010 | Vogan et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0075482 A1 | 3/2011 | Shepard et al. |
| 2011/0107049 A1 | 5/2011 | Kwon et al. |
| 2011/0149657 A1 | 6/2011 | Haratsch et al. |
| 2011/0199823 A1 | 8/2011 | Bar-Or et al. |
| 2011/0302354 A1 | 12/2011 | Miller |

FOREIGN PATENT DOCUMENTS

| | | |
|---|---|---|
| EP | 1605509 A1 | 12/2005 |
| WO | 9610256 A1 | 4/1996 |
| WO | 9828745 A1 | 7/1998 |
| WO | 02100112 A1 | 12/2002 |
| WO | 03100791 A1 | 12/2003 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009038961 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |
| WO | 2011024015 A1 | 3/2011 |

OTHER PUBLICATIONS

U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
U.S. Appl. No. 11/995,814 Official Action dated Dec. 17, 2010.
U.S. Appl. No. 12/388,528 Official Action dated Nov. 29, 2010.
U.S. Appl. No. 12/251,471 Official Action dated Jan. 3, 2011.
Engineering Windows 7, "Support and Q&A for Solid-State Drives", e7blog, May 5, 2009.
Micron Technology Inc., "Memory Management in NAND Flash Arrays", Technical Note, year 2005.
Kang et al., "A Superblock-based Flash Translation Layer for NAND Flash Memory", Proceedings of the 6th ACM & IEEE International Conference on Embedded Software, pp. 161-170, Seoul, Korea, Oct. 22-26, 2006.
Park et al., "Sub-Grouped Superblock Management for High-Performance Flash Storages", IEICE Electronics Express, vol. 6, No. 6, pp. 297-303, Mar. 25, 2009.
"How to Resolve "Bad Super Block: Magic Number Wrong" in BSD", Free Online Articles Director Article Base, posted Sep. 5, 2009.
UBUNTU Forums, "Memory Stick Failed IO Superblock", posted Nov. 11, 2009.
Super User Forums, "SD Card Failure, can't read superblock", posted Aug. 8, 2010.
U.S. Appl. No. 12/987,174 "Redundant Data Storage in Multi-Die Memory Systems", filed Jan. 10, 2011.
U.S. Appl. No. 12/987,175 "Redundant Data Storage Schemes for Multi-Die Memory Systems" filed Jan. 10, 2011.
U.S. Appl. No. 12/963,649 "Memory Management Schemes for Non-Volatile Memory Devices" filed Dec. 9, 2010.
U.S. Appl. No. 13/021,754 "Reducing Peak Current in Memory Systems" filed Feb. 6, 2011.
U.S. Appl. No. 12/323,544 Official Action dated Mar. 9, 2012.
Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI-2 (SAS-2)", INCITS document T10/1760-D, revision 15a, Feb. 22, 2009.
JEDEC Standard JESD84-C44, "Embedded MultiMediaCard (e•MMC) Mechanical Standard, with Optional Reset Signal", Jedec Solid State Technology Association, USA, Jul. 2009.
JEDEC, "UFS Specification", version 0.1, Nov. 11, 2009.
SD Group and SD Card Association, "SD Specifications Part 1 Physical Layer Specification", version 3.01, draft 1.00, Nov. 9, 2009.
COMPAQ et al., "Universal Serial Bus Specification", revision 2.0, Apr. 27, 2000.
Serial ATA International Organization, "Serial ATA Revision 3.0 Specification", Jun. 2, 2009.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
U.S. Appl. No. 12/534,898 Official Action dated Mar. 23, 2011.
U.S. Appl. No. 13/047,822, filed Mar. 15, 2011.
U.S. Appl. No. 13/069,406, filed Mar. 23, 2011.
U.S. Appl. No. 13/088,361, filed Apr. 17, 2011.
Agrell et al., "Closest Point Search in Lattices", IEEE Transactions on Information Theory, vol. 48, No. 8, pp. 2201-2214, Aug. 2002.
Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Goodman et al., "On-Chip ECC for Multi-Level Random Access Memories," Proceedings of the IEEE/CAM Information Theory Workshop, Ithaca, USA, Jun. 25-29, 1989.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Horstein, "On the Design of Signals for Sequential and Nonsequential Detection Systems with Feedback," IEEE Transactions on Information Theory IT—12:4 (Oct. 1966), pp. 448-455.
Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.
Kawaguchi et al. 1995. A flash-memory based file system. In Proceedings of the USENIX 1995 Technical Conference, New Orleans, Louisiana. 155-164.
Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.
Lee et al., "Effects of Floating Gate Interference on NAND Flash Memory Cell Operation", IEEE Electron Device Letters, vol. 23, No. 5, pp. 264-266, May 2002.
Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.
Mielke et al., "Recovery Effects in the Distributed Cycling of Flash Memories", IEEE 44th Annual International Reliability Physics Symposium, pp. 29-35, San Jose, USA, Mar. 2006.
Onfi, "Open NAND Flash Interface Specification," revision 1.0, Dec. 28, 2006.
Phison Electronics Corporation, "PS8000 Controller Specification (for SD Card)", revision 1.2, Document No. S-07018, Mar. 28, 2007.
Shalvi, et al., "Signal Codes," Proceedings of the 2003 IEEE Information Theory Workshop (ITW' 2003), Paris, France, Mar. 31-Apr. 4, 2003.
Shiozaki, A., "Adaptive Type-II Hybrid Broadcast ARQ System", IEEE Transactions on Communications, vol. 44, Issue 4, pp. 420-422, Apr. 1996.
Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.
ST Microelectronics, "Wear Leveling in Single Level Cell NAND Flash Memories," Application note AN-1822 Geneva, Switzerland, Feb. 2007.
Takeuchi et al., "A Double Level $V_{th}$ Select Gate Array Architecture for Multi-Level NAND Flash Memories", Digest of Technical Papers, 1995 Symposium on VLSI Circuits, pp. 69-70, Jun. 8-10, 1995.
Takeuchi et al., "A Multipage Cell Architecture for High-Speed Programming Multilevel NAND Flash Memories", IEEE Journal of Solid State Circuits, vol. 33, No. 8, Aug. 1998.
Wu et al., "eNVy: A non-Volatile, Main Memory Storage System", Proceedings of the 6th International Conference on Architectural support for programming languages and operating systems, pp. 86-87, San Jose, USA, 1994.
International Application PCT/IL2007/000575 Patentability report dated Mar. 26, 2009.
International Application PCT/IL2007/000575 Search Report dated May 30, 2008.
International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
U.S. Appl. No. 11/949,135 Official Action dated Oct. 2, 2009.
U.S. Appl. No. 12/019,011 Official Action dated Nov. 20, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation for Voltage Drifts in Analog Memory Cells" filed Oct. 15, 2008.
Sommer et al., U.S. Appl. No. 12/497,707 "Data Storage in Analog Memory Cells with Protection Against Programming Interruption" filed Jul. 6, 2009.
Winter et al., U.S. Appl. No. 12/534,893 "Improved Data Storage in Analog Memory Cells Using Modified Pass Voltages" filed Aug. 4, 2009.
Winter et al., U.S. Appl. No. 12/534,898 "Data Storage Using Modified Voltages" filed Aug. 4, 2009.
Shalvi et al., U.S. Appl. No. 12/551,583 "Segmented Data Storage" filed Sep. 1, 2009.
Shalvi et al., U.S. Appl. No. 12/551,567 "Reliable Data Storage in Analog Memory Cells Subjected to Long Retention Periods" filed Sep. 1, 2009.
Perlmutter et al., U.S. Appl. No. 12/558,528 "Estimation of Memory Cell Read Thresholds by Sampling Inside Programming Level Distribution Intervals" filed Sep. 13, 2009.
Sokolov, D., U.S. Appl. No. 12/579,430 "Efficient Programming of Analog Memory Cell Devices" filed Oct. 15, 2009.
Shalvi, O., U.S. Appl. No. 12/579,432 "Efficient Data Storage in Storage Device Arrays" filed Oct. 15, 2009.
Sommer et al., U.S. Appl. No. 12/607,078 "Data Scrambling in Memory Devices" filed Oct. 28, 2009.
Sommer et al., U.S. Appl. No. 12/607,085 "Data Scrambling Schemes for Memory Devices" filed Oct. 28, 2009.
Shalvi et al., U.S. Appl. No. 12/618,732 "Storage at M Bits/Cell Density in N Bits/Cell Analog Memory Cell Devices, M>N" filed Nov. 15, 2009.
Sommer et al., U.S. Appl. No. 12/649,358 "Efficient Readout Schemes for Analog Memory Cell Devices" filed Dec. 30, 2009.
Sommer et al., U.S. Appl. No. 12/649,360 "Efficient Readout Schemes for Analog Memory Cell Devices Using Multiple Read Threshold Sets" filed Dec. 30, 2009.
Rotbard et al., U.S. Appl. No. 12/649,382 "Rejuvenation of Analog Memory Cells" filed Dec. 30, 2009.
Shachar et al., U.S. Appl. No. 12/688,883 "Hierarchical data storage system" filed Jan. 17, 2010.
Shalvi, O., U.S. Appl. No. 12/758,044 "Memory device with negative thresholds" filed Apr. 12, 2010.
Sokolov et al., U.S. Appl. No. 12/714,501 "Selective Activation of Programming Schemes in Analog Memory Cell Arrays" filed Feb. 28, 2010.
Sokolov et al., U.S. Appl. No. 12/728,287 "Use of host system resources by memory controller" filed Mar. 22, 2010.
Sommer et al., U.S. Appl. No. 12/728,296 "Database of Memory Read Thresholds" filed Mar. 22, 2010.
Sommer et al., U.S. Appl. No. 12/758,003 "Selective re-programming of analog memory cells" filed Apr. 11, 2010.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
U.S. Appl. No. 12/344,233 Official Action dated Jun. 24, 2011.
U.S. Appl. No. 11/995,813 Official Action dated Jun. 16, 2011.
Berman et al., "Mitigating Inter-Cell Coupling Effects in MLC NAND Flash via Constrained Coding", Flash Memory Summit, Santa Clara, USA, Aug. 19, 2010.
U.S. Appl. No. 12/178,318 Official Action dated May 31, 2011.
CN Patent Application # 200780026181.3 Official Action dated Apr. 8, 2011.
Huffman, A., "Non-Volatile Memory Host Controller Interface (NVMHCI)", Specification 1.0, Apr. 14, 2008.
Panchbhai et al., "Improving Reliability of NAND Based Flash Memory Using Hybrid SLC/MLC Device", Project Proposal for CSci 8980—Advanced Storage Systems, University of Minnesota, USA, Spring 2009.
U.S. Appl. No. 11/957,970 Official Action dated May 20, 2010.
Shalvi et al., U.S. Appl. No. 12/822,207 "Adaptive Over-Provisioning in Memory Systems" filed Jun. 24, 2010.
Wei, L., "Trellis-Coded Modulation With Multidimensional Constellations", IEEE Transactions on Information Theory, vol. IT-33, No. 4, pp. 483-501, Jul. 1987.
U.S. Appl. No. 13/114,049 Official Action dated Sep. 12, 2011.
U.S. Appl. No. 12/405,275 Official Action dated Jul. 29, 2011.
Conway et al., "Sphere Packings, Lattices and Groups", 3rd edition, chapter 4, pp. 94-135, Springer, New York, USA 1998.
Chinese Patent Application # 200780040493.X Official Action dated Jun. 15, 2011.
U.S. Appl. No. 12/037,487 Official Action dated Oct. 3, 2011.
U.S. Appl. No. 12/649,360 Official Action dated Aug. 9, 2011.
U.S. Appl. No. 13/192,504, filed Jul. 28, 2011.

U.S. Appl. No. 13/192,852, filed Aug. 2, 2011.
U.S. Appl. No. 13/231,963, filed Sep. 14, 2011.
U.S. Appl. No. 13/239,408, filed Sep. 22, 2011.
U.S. Appl. No. 13/239,411, filed Sep. 22, 2011.
U.S. Appl. No. 13/214,257, filed Aug. 22, 2011.
U.S. Appl. No. 13/192,501, filed Jul. 28, 2011.
U.S. Appl. No. 13/192,495, filed Jul. 28, 2011.
U.S. Appl. No. 12/880,101 "Reuse of Host Hibernation Storage Space by Memory Controller", filed Sep. 12, 2010.
U.S. Appl. No. 12/890,724 "Error Correction Coding Over Multiple Memory Pages", filed Sep. 27, 2010.
U.S. Appl. No. 12/171,797 Official Action dated Aug. 25, 2010.
U.S. Appl. No. 12/497,707 Official Action dated Sep. 15, 2010.
U.S. Appl. No. 11/995,801 Official Action dated Oct. 15, 2010.
Numonyx, "M25PE16: 16-Mbit, page-erasable serial flash memory with byte-alterability, 75 MHz SPI bus, standard pinout", Apr. 2008.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
U.S. Appl. No. 11/945,575 Official Action dated Aug. 24, 2010.
U.S. Appl. No. 12/045,520 Official Action dated Nov. 16, 2010.
US 7,161,836, 01/2007, Wan et al. (withdrawn)

* cited by examiner

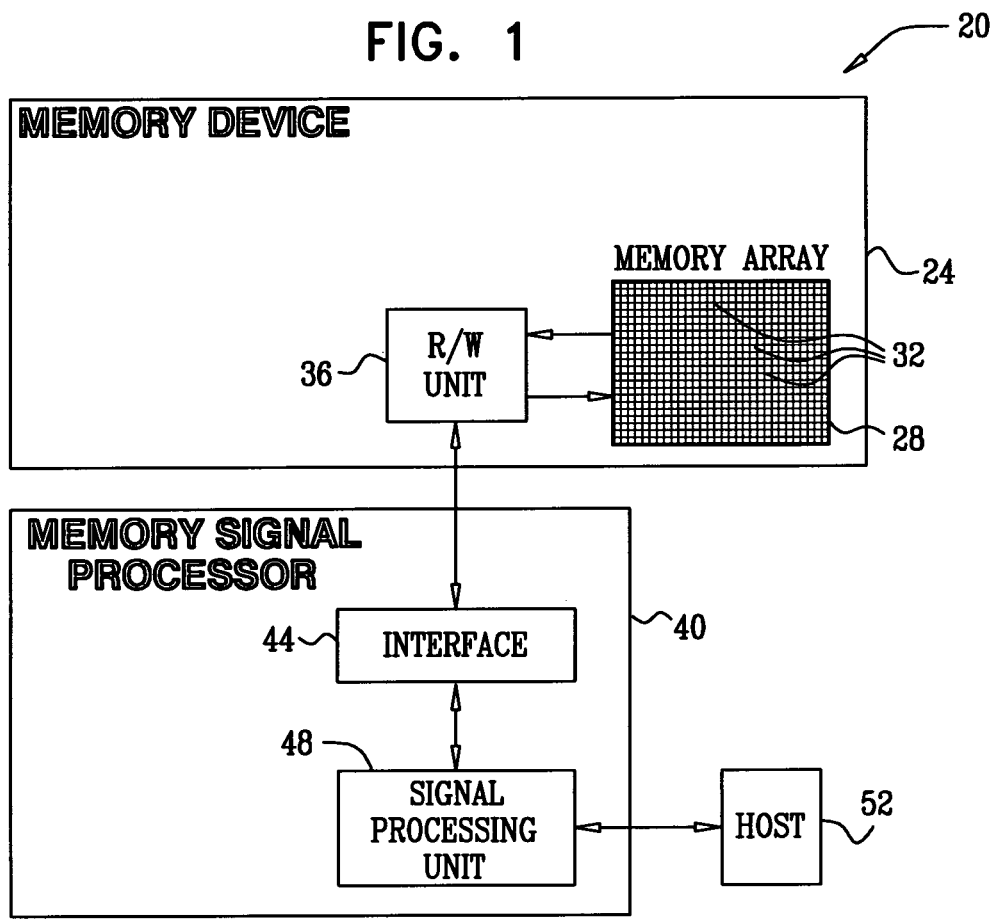

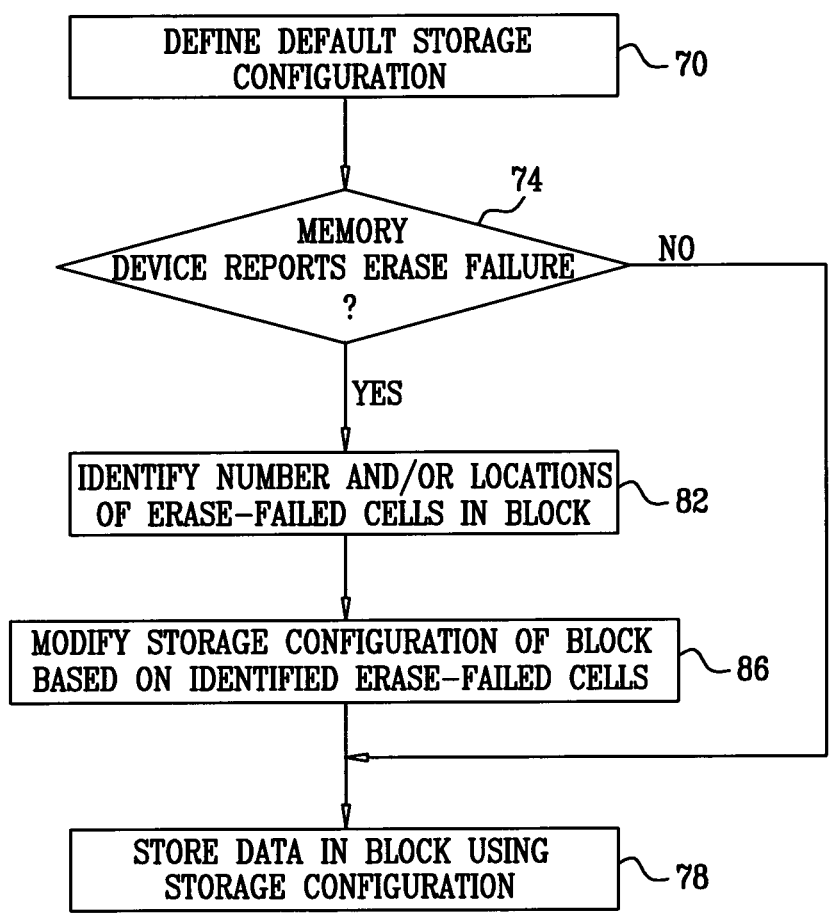

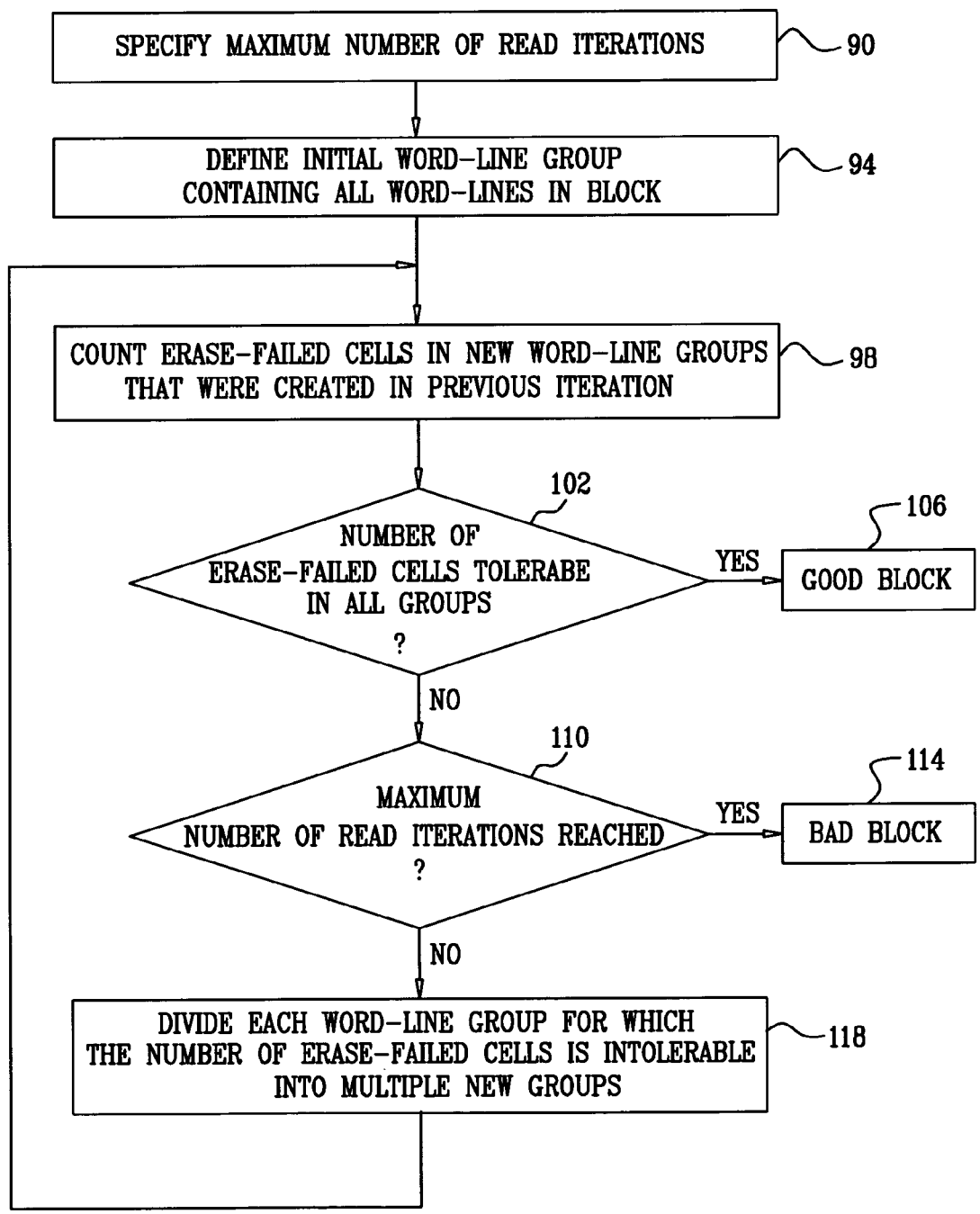

DATA STORAGE IN ANALOG MEMORY CELL ARRAYS HAVING ERASE FAILURES

FIELD OF THE INVENTION

The present invention relates generally to memory devices, and particularly to methods and systems for data storage in memory devices having erase failures.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. The storage value represents the information stored in the cell. In Flash memories, for example, each analog memory cell holds a certain amount of electrical charge. The range of possible analog values is typically divided into regions, each region corresponding to a combination of one or more data bit values that may be stored in a given cell. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Arrays of analog memory cells are typically erased before they are used for storing data. A memory cell array is usually partitioned into cell groups, referred to as erasure blocks, which are erased simultaneously. In many memory devices, one of the programming levels is defined as an erased level, and the cells are erased by applying erasure pulses or voltages. Often, the erased level corresponds to a negative threshold voltage, and the cells are erased by applying negative erasure pulses. Various techniques are known in the art for erasing analog memory cells and for verifying that the cells are erased properly.

For example, U.S. Patent Application Publication 2004/0114437, whose disclosure is incorporated herein by reference, describes a method of erasing a nonvolatile memory so as to compact the distribution of erased cell threshold voltages within a restricted range around a target erased threshold voltage. Erase pulses are applied to the cells until a determination is made that adequate erasure has been realized. Once erasure has been verified, the distribution of erased threshold voltages is compacted by sustaining, for a predetermined length of time, the simultaneous application of a gate voltage that is equal to the target erased threshold voltage and a highly positive drain voltage.

U.S. Pat. No. 5,237,535, whose disclosure is incorporated herein by reference, describes a method of repairing over-erased cells in a Flash memory array, which includes a column having a first cell and a second cell. Repair begins by determining whether the first cell is over-erased and applying a programming pulse if so. Next, the second cell is examined to determine whether it is over-erased. A programming pulse is applied to the second cell if it is over-erased. Afterward, if either of the cells was over-erased, the repair pulse voltage level is incremented. These steps are repeated until none of the cells in the column is identified as over-erased.

SUMMARY OF THE INVENTION

An embodiment of the present invention provides a method for data storage, including:

performing an erasure operation on a group of analog memory cells;

identifying as erase-failed cells one or more of the memory cells in the group that failed the erasure operation;

modifying, responsively to the identified erase-failed cells, a storage configuration that is used for programming the analog memory cells in the group; and storing data in the group of the analog memory cells using the modified storage configuration.

In some embodiments, storing the data includes storing a portion of the data in at least one of the erase-failed cells. In a disclosed embodiment, identifying the erase-failed cells includes identifying a distribution of locations of the erase-failed cells across the group of the memory cells, and modifying the storage configuration includes setting the storage configuration responsively to the identified distribution of the locations. In some embodiments, the analog memory cells in the group are arranged in an array having multiple cell sub-groups, such that the cells in each of the sub-groups are programmed simultaneously, and identifying the distribution of the locations includes identifying a worst-performing sub-group containing a maximum number of the erase-failed cells.

In an embodiment, identifying the worst-performing sub-group includes applying a sequence of iterations to the multiple sub-groups, such that each iteration retains only a subset of the sub-groups that were retained by a preceding iteration in the sequence by selecting the subgroups having a count of the erase-failed cells that is above a predefined threshold. In another embodiment, the analog memory cells are arranged in multiple rows, each sub-group includes cells that are located in a respective row, and retaining the subset of the sub-groups includes biasing the rows corresponding to the sub-groups in the subset with a first bias voltage and biasing the rows corresponding to the sub-groups other than the sub-groups in the subset using a second bias voltage that is different from the first bias voltage. In yet another embodiment, applying the sequence of the iterations includes predefining a maximum permitted number of the iterations, and terminating the sequence upon reaching the maximum permitted number of the iterations.

In still another embodiment, the method includes classifying the group of the memory cells as unusable responsively to the identified distribution of the locations. In an embodiment, the analog memory cells are arranged in multiple columns, and modifying the storage configuration includes setting the storage configuration responsively to a count of the columns containing at least one of the erase-failed cells. In a disclosed embodiment, identifying the erase-failed cells includes identifying the erase-failed cells responsively to receiving a notification of a failure of the erasure operation.

In some embodiments, modifying the storage configuration includes modifying an Error Correction Code (ECC) that encodes the data in the group of the memory cells, modifying a storage capacity of at least some of the memory cells in the group and/or modifying a parameter of an iterative Program and Verify (P&V) process that is used for storing the data in the group of the memory cells. Additionally or alternatively, modifying the storage configuration may include setting the storage configuration responsively to a count of programming and erasure cycles applied to the group of the memory cells.

In an embodiment, identifying the erase-failed cells includes identifying locations of the erase-failed cells in the group of the memory cells and storing the identified locations, and the method includes reading the memory cells in the group and reconstructing the data responsively to the stored locations of the erase-failed cells. In another embodiment, storing the data includes encoding the data with an Error Correction Code (ECC), and reconstructing the data includes decoding the ECC using an ECC decoding process that accepts erasure indications, and identifying the locations of the erase-failed cells as erasure indications to the ECC decoding process. In yet another embodiment, storing the data and reading the memory cells include skipping the identified locations of the erase-failed cells.

There is additionally provided, in accordance with an embodiment of the present invention, apparatus for data storage, including:

an interface, which is operative to communicate with a memory device that includes a plurality of analog memory cells; and circuitry, which is coupled to perform an erasure operation on a group of the analog memory cells, to identify as erase-failed cells one or more of the memory cells in the group that failed the erasure operation, to modify, responsively to the identified erase-failed cells, a storage configuration that is used for programming the analog memory cells in the group, and to store data in the group of the analog memory cells using the modified storage configuration.

In a disclosed embodiment, the circuitry includes:

a Read/Write (R/W) unit, which is packaged in the memory device and is coupled to identify the erase-failed cells and to report information regarding the identified erase-failed cells over the interface; and a processor, which is external to the memory device and is coupled to modify the storage configuration responsively to the information reported by the R/W unit.

In an alternative embodiment, the circuitry includes a processor that is external to the memory device.

There is also provided, in accordance with an embodiment of the present invention, apparatus for data storage, including:

a memory device, which includes a plurality of analog memory cells; and a processor, which is coupled to perform an erasure operation on a group of the analog memory cells, to identify as erase-failed cells one or more of the memory cells in the group that failed the erasure operation, to modify, responsively to the identified erase-failed cells, a storage configuration that is used for programming the analog memory cells, and to store data in the group of the analog memory cells using the modified storage configuration.

There is further provided, a memory device, including:

a plurality of analog memory cells; and

Read/Write (R/W) circuitry, which is coupled to perform an erasure operation on a group of the analog memory cells, to identify as erase-failed one or more of the memory cells in the group that failed the erasure operation, and to report information regarding the identified erase-failed cells to a controller external to the memory device, so as to enable the controller to store data in the group of the analog memory cells.

The present invention will be more fully understood from the following detailed description of the embodiments thereof, taken together with the drawings in which:

BRIEF DESCRIPTION OF THE DRAWINGS

FIG. 1 is a block diagram that schematically illustrates a memory system, in accordance with an embodiment of the present invention;

FIG. 3 is a flow chart that schematically illustrates a method for storing data in a memory block having erase-failed memory cells, in accordance with an embodiment of the present invention;

FIG. 4 is a flow chart that schematically illustrates a method for assessing a distribution of erase failures in a memory block, in accordance with an embodiment of the present invention;

DETAILED DESCRIPTION OF EMBODIMENTS

Overview

Figure 2A:
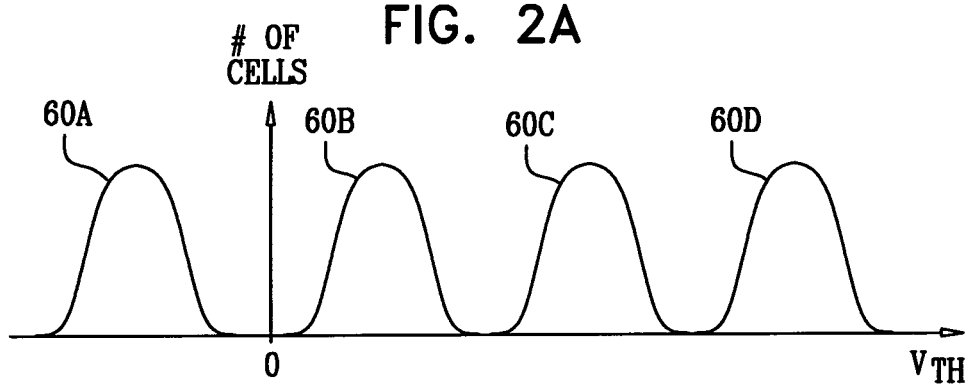
FIGS. 2A-2C are graphs showing threshold voltage distributions in a group of analog memory cells, in accordance with an embodiment of the present invention.

Known schemes for storing data in analog memory cell arrays typically verify that a given memory block is erased properly before permitting the block to be used for data storage. In such schemes, a block containing cells that failed to erase properly is marked as a "bad block" and removed from service.

In most practical cases, however, the number of erase-failed cells in a given block is extremely small, while the vast majority of cells in the block are fully functional. Removing such a memory block from service causes unnecessary degradation in the memory device's storage capacity, since many thousands of fully-operational cells are discarded because of a small number of erase failures. The capacity degradation further increases over the life cycle of the memory device, as additional blocks fail to erase and are removed from service.

Embodiments of the present invention that are described hereinbelow provide methods and systems for storing data in memory blocks that contain erase-failed memory cells. The methods and systems described herein allow many such blocks to remain in service, thus increasing the storage capacity of the memory device and extending its useful lifetime.

In some embodiments, a Memory Signal Processor (MSP) stores data in a memory device, which comprises an array of analog memory cells. After performing an erasure operation on a group of memory cells (typically a block), the MSP may identify one or more erase-failed cells in the group that failed the erasure operation. The MSP modifies, based on the identified erase-failed cells, a storage configuration that is used for programming the analog memory cells. Data is subsequently stored in the group of analog memory cells using the modified storage configuration.

By modifying the storage configuration, the MSP matches the way data is stored in the cells to the expected degradation caused by the presence of erase-failed cells, so that data storage reliability is not compromised. In other words, the MSP stores data in the group of memory cells, including in the erase-failed cells, even though erase failures were detected. The data can still be reconstructed successfully because of the enhanced storage configuration.

The storage configuration can be modified based on, for example, the total number of erase-failed cells, the way the erase-failed cells are distributed across the array and/or the values stored in the erase-failed cells. The MSP may modify the storage configuration, for example, by modifying the storage capacity of the cells, modifying an Error Correction Code (ECC) that is used for encoding the data stored in the cells, and adjusting programming parameters such as verification thresholds and Program and Verify (P&V) step size.

In some embodiments, the MSP assesses the distribution of erase failures per word line, and sets the storage configuration accordingly. The number of erase failures per word line is an important figure-of-merit, especially when the data is encoded with ECC separately within each word line. In these configurations, the number of erase failures per word line influences the ability of the ECC to correct errors that may be caused by storing data in erase-failed cells. Efficient methods for identifying a word line (or group of word lines) having a maximum number of erase failures are described herein. Having identified the maximum number of erase failures per word line, the MSP can either set the storage configuration accordingly, or mark the block as bad. These methods can also be applied to individual memory pages within a word line.

Other disclosed methods adapt the storage configuration of memory blocks and classify blocks as good or bad based on the estimated number of bit lines having erase-failed cells or based on the history of previous Programming/Erasure (P/E) cycles the blocks have gone through.

When using the methods and systems described herein, the number of blocks that are classified as bad and removed from service is reduced considerably in comparison with known methods. As such, the disclosed methods and systems increase the storage capacity of memory devices and extend their useful lifetime.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory cell array comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and CTF Flash cells, PCM, NROM, FRAM, MRAM and DRAM cells. Memory cells 32 may comprise Single-Level Cells (SLC) or Multi-Level Cells (MLC, also referred to as multi-bit cells).

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values to the cell. (The term MLC is used herein to describe any cell configuration that stores more than a single bit per cell. MLC configurations may store, for example, two, three or four bits per cell.)

Memory device 24 comprises a reading/writing (R/W) unit 36, which converts data for storage in the memory device to storage values and writes them into memory cells 32. In alternative embodiments, the R/W unit does not perform the conversion, but is provided with voltage samples, i.e., with the storage values for storage in the cells. The R/W unit typically (although not necessarily) programs the cells using an iterative Program and Verify (P&V) process, as is known in the art. When reading data out of array 28, R/W unit 36 converts the storage values of memory cells 32 into digital samples having a resolution of one or more bits. Data is typically written to and read from the memory cells in groups that are referred to as pages. In addition to writing and reading data, R/W unit 36 erases groups of memory cells 32 before they are used for storing data.

The storage and retrieval of data in and out of memory device 24 is performed by a Memory Signal Processor (MSP) 40. MSP 40 comprises an interface 44 for communicating with memory device 24, and a signal processing unit 48, which processes the data that is written into and read from device 24. In some embodiments, unit 48 produces the storage values for storing in the memory cells and provides these values to R/W unit 36. Alternatively, unit 48 provides the data for storage, and the conversion to storage values is carried out by the R/W unit internally to the memory device.

MSP 40 communicates with a host 52, for accepting data for storage in the memory device and for outputting data retrieved from the memory device. MSP 40, and in particular unit 48, may be implemented in hardware. Alternatively, MSP 40 may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and MSP 40 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 40 can be implemented in software and carried out by a processor or other element of the host system, or by a suitable memory controller. In some implementations, a single MSP 40 may be connected to multiple memory devices 24. In yet another embodiment, some or all of the MSP functionality may be carried out by a separate unit, referred to as a memory extension, which acts as a slave of memory device 24.

Typically, the MSP (or any other controller or processor that carries out some or all of the methods described herein) comprises a general-purpose processor, which is programmed in software to carry out the functions described herein. The software may be downloaded to the processor in electronic form, over a network, for example, or it may, alternatively or additionally, be provided and/or stored on tangible media, such as magnetic, optical, or electronic memory.

Memory cells 32 of array 28 are typically arranged in a grid having multiple rows and columns, commonly referred to as word lines and bit lines, respectively. The array is typically divided into multiple pages, i.e., groups of memory cells that are programmed and read simultaneously. Cells are typically erased in groups of word lines that are referred to as erasure blocks.

In some embodiments, R/W unit 36 programs memory cells 32 using an iterative Program and Verify (P&V) process. In a typical P&V process, an entire memory page is written by applying a sequence of programming pulses to a group of memory cells that are mapped to this page. The level of the programming pulses increases incrementally from pulse to pulse. The storage values programmed in the cells are read ("verified") after each pulse, and the iterations continue until the desired levels are reached.

Threshold Voltage Distributions and Proper Cell Erasure

Figure 2B:
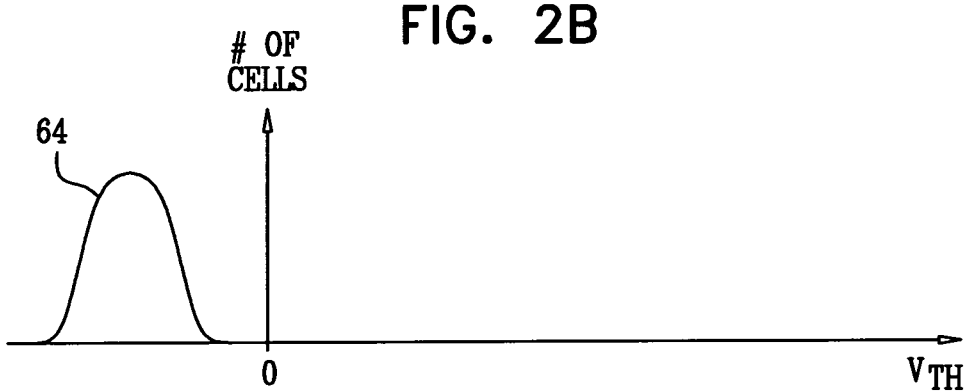
Figure 2C:
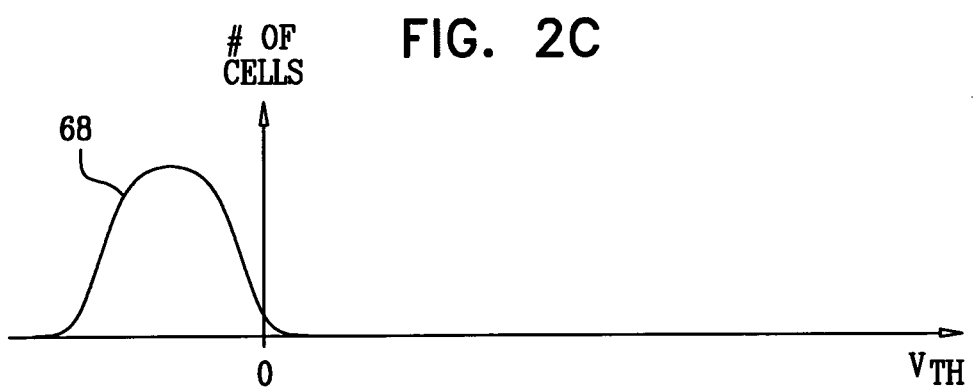

FIGS. 2A-2C are graphs showing threshold voltage distributions in a group of analog memory cells 32, such as in a given erasure block or word line, in accordance with an embodiment of the present invention. In the present example, cells 32 comprise four-level cells, each storing two data bits, although the methods described herein are applicable to memory cells storing any number of bits in any number of programming levels.

In the four-level example of FIGS. 2A-2C, each cell can be programmed to one of four possible levels, each corresponding to a certain combination of two bit values. Because of various errors and tolerances, the threshold voltages in the cells that belong to a given programming level are distributed around the nominal threshold voltage of this level.

FIG. 2A shows the threshold voltage distribution when the cells are programmed with data. In the present example, the threshold voltages are distributed in accordance with distributions 60A ... 60D, which correspond to the four programming levels.

FIG. 2B shows the threshold voltage distribution before data is stored in the group of cells, i.e., when the cells are erased. In this example, one of the programming levels is defined as an erased level, and the cell erasure process attempts to bring all the cells in the block to this level. The threshold voltages of the erased cells are distributed in accordance with a distribution 64.

In the embodiments described herein, the erased level has negative threshold voltages. This choice is, however, not mandatory. In alternative embodiments, any other programming level (i.e., any other range of threshold voltages) can be defined as the erased level.

Typically, an erase verification process comprises verifying that the cells' threshold voltages are negative, such as by reading the cells using a read threshold that is positioned at 0V. Cells whose threshold voltage is read as negative are regarded as properly erased, and vice versa. In some embodiments, the cells are verified for over-erasure, as well. In other words, the threshold voltage of an erased cell is sometimes not permitted to be below a certain negative threshold. Erase verification may be performed by the MSP or by R/W unit 36 in the memory device.

FIG. 2C shows the threshold voltage distribution when some of the cells are not erased properly. The threshold voltages of the erased cells are distributed in accordance with a distribution 68. Distribution 68 is wider than distribution 64. Additionally, some of the cells in distribution 68 have positive threshold voltages, which may be interpreted as not being erased.

This situation may be caused by an improper erasure process, e.g., when the erasure voltage applied to the cells is insufficient. Alternatively, improper erasure may result from defects in some of the memory cells or from any other reason. In many devices, the likelihood of erase failures increases with the number of programming/erasure cycles the block has gone through. In some cases, a block that was properly erased may become improperly erased over time, because of voltage drift in the cells.

As can be seen in the figure, however, the vast majority of the cells in distribution 68 is still negative and can be regarded as properly erased. The methods and systems described below allow a memory block, which has a threshold voltage distribution such as distribution 68, to be used for data storage.

Data Storage in Memory Blocks Having Erase-Failed Cells

Embodiments of the present invention provide methods and systems, which store data in memory blocks having memory cells that failed to erase properly. In some embodiments, system 20 identifies the erase-failed cells in a given block of array 28. The system then specifies a storage configuration for storing data in the block based on the identified erase-failed cells.

In the description that follows, the erase-failed cells are identified by MSP 40. In alternative embodiments, however, R/W unit 36 in memory device 24 may comprise circuitry that identifies erase-failed cells and reports information regarding these cells (e.g., their number, distribution and/or locations)

to the MSP. Counting the erase-failed cells internally in the memory device is often more power-, throughput- and time-efficient than performing these operations in an external controller such as the MSP. On the other hand, counting the erase-failed cells by the external controller may be more efficient in terms of the memory device die size.

In the embodiments described herein, an erased cell whose threshold voltage is not negative is regarded as erase-failed. Alternatively, however, the system may regard cells as erase-failed cells based on any other suitable criterion. For example, over-erased cells can also be regarded as erase-failed.

In order to specify the appropriate storage configuration for a given erased block, the MSP identifies the number, locations and/or distribution of the erase-failed cells in the block. For example, the MSP may count the total number of cells in the block that failed to erase (e.g., the total number of cells whose threshold voltage is positive). In some embodiments, the memory device comprises a NAND Flash device, in which the cells are arranged in multiple NAND strings, as are known in the art. In these configurations, the MSP can approximate the total number of erase-failed cells by the number of NAND strings having at least one erase-failed cell. Counting NAND strings rather than individual cells reduces the complexity of the operation considerably, since it does not require separate reading operations per each word line in the block.

Further alternatively, the MSP may determine the distribution of the erase failures across the array. This information can be used for optimal selection of the appropriate storage configuration, as will be explained below. For example, each block of cells 32 is typically divided into sub-groups (e.g., word lines or pages), such that the cells in each sub-group are programmed and read simultaneously. The MSP may count the number of erase-failed cells in each sub-group in the block (e.g., in each word line, in odd- and even-order cells or in different bits of the cells of each word line). In some embodiments, the MSP constructs a histogram of the threshold voltages of the erase-failed cells in each sub-group. For example, the MSP may read each sub-group using N different read thresholds, and count the number of cells (per sub-group) whose threshold voltages exceed each read threshold. The description that follows refers mainly to word lines, however the methods and systems described herein can be applied to other sorts of cell sub-groups.

The MSP may set the storage configuration for the given block based on the identified erase-failed cells in a number of ways. For example, the MSP may modify the storage capacity of the cells, i.e., the number of bits per cell. In some embodiments, the MSP sets a certain storage configuration for the entire block. Alternatively, the MSP may modify the storage configuration selectively for parts of the block, e.g., for pages or word lines that suffer from a high number of erase-failed cells and/or from erase-failed cells having exceedingly high threshold voltages. Modifying the capacity can be carried out, for example, by modifying the number of programming levels used for programming the cells or by skipping some of the pages in the block. In some embodiments, the data stored in the cells is encoded with an Error Correction Code (ECC), and the MSP modifies the block's capacity by modifying the redundancy level (e.g., the code rate) of the ECC.

Additionally or alternatively, the MSP may change the ECC that is used for encoding the stored data so as to match the number, locations and/or distribution of the identified erase-failed cells. For example, erase-failed cells are typically characterized by a specific type of read error, in which the cell's threshold voltage was meant to be in the erased level but is read as being in the next-higher programming level. A given ECC may be optimized to provide a high correction capability for this type of error. The MSP may employ this ECC in blocks or pages having a high number of erase-failed cells. In other blocks or pages, the MSP may use another ECC, which has similar correction capabilities for different types of errors.

As noted above, R/W unit 36 typically programs cells 32 using an iterative P&V process. In such a process, each programming level has a corresponding verify threshold, and the R/W unit verifies that the cells reach their intended programming levels by comparing the cells' threshold voltages to the appropriate verify thresholds. As another example of modifying the storage configuration, the MSP may modify the verify thresholds based on the identified erase-failed cells. Modifying the verify thresholds effectively modifies the range of threshold voltages occupied by the different programming levels.

In order to overcome a high number of erase failures, the MSP may increase the value of the lowest verify threshold, so as to reduce the number of erase-failed cells whose threshold voltages exceed the lowest verify threshold. Modification of the verify threshold can be performed en bloc for the entire block, or for individual pages having a high number of erase failures. The MSP may determine the appropriate values of the verify thresholds based on a histogram the threshold voltages of the erase-failed cells, if such a histogram is available.

When the cells are programmed using an iterative P&V process, the MSP may modify the P&V step size, i.e., the amplitude difference between successive programming pulses, based on the identified erase-failed cells. In these embodiments, if the number of erase failures is high, the MSP may reduce the P&V step size to improve the programming accuracy. The higher accuracy reduces the likelihood of read errors, and therefore improves the resilience to errors caused by erase failures. Programming the cells using a small P&V step size increases the programming time.

Therefore, the MSP typically uses a small step size only when necessary, i.e., only in blocks, word lines or pages that suffer from a high number of erase-failed cells. Improved accuracy may be especially important when the verify thresholds are modified, since this modification often reduces the total available threshold voltage range.

Typically, a cell is declared as erase-failed when its threshold voltage exceeds a certain erase verify threshold (which is often set to 0V). The erase verify threshold is used for differentiating between the erased level and the first programming level. In many cases, a slight increase in the value of this threshold will cause many of the erase-failed cells to fall below the threshold and be regarded as properly erased. The slight increase in the erase verify threshold value can often be tolerated with little or no performance degradation.

Thus, in some embodiments, the MSP modifies the storage configuration by slightly increasing the value of the erase verify threshold (and sometimes also the lowest read threshold that is used for reading the cells). For example, when the nominal value of the erase verify threshold is 0V, the MSP may shift the threshold to 0.1 or 0.2V. In some embodiments, the MSP shifts the erase verify threshold for a given block in response to a notification from the memory device that the block has failed to erase. Additionally or alternatively, the MSP may vary the erase verify threshold based on other criteria, such as based on the number of programming and erasure cycles the block has gone through, or the error correction capabilities of the ECC.

In some embodiments, the MSP stores the locations of the identified erase-failed cells, such as in a suitable location in array 28. The MSP can use the stored locations of the erase-failed cells in order to improve the quality of reading the data stored in the block. For example, the MSP sometimes uses an ECC decoding process, which takes into account quality metrics or other indications as to the reliability or confidence of the input values. Any suitable indication can be used for this purpose, such as, for example, Log-Likelihood Ratios (LLR) of certain bits, parameters of likelihood functions used with maximum-likelihood decoders, and various other weighting functions. In particular, some ECC decoders accept indications in the form of erasures. An erasure typically comprises an indication that a specific input value is uncertain (i.e., conveys little or no information as to the stored data) and should be given little or no weight in the decoding process.

The MSP may use such indications to improve the performance of the ECC decoding process. For example, in some embodiments the MSP stores data in the block regardless of whether the cells are erased properly or not. When reading the data, the MSP indicates to the ECC decoding process which of the read values was read from an erase-failed cell. The MSP may assign the values read from erase-failed cells a relatively low metric value, in comparison with values read from functional cells. Alternatively, the MSP may mark the values read from erase-failed cells as erasures to the ECC decoder. When retrieving the data, the MSP decodes the ECC based on the indications described above. By means of the indications, the ECC decoding process assigns little or no weight to the values read from erase-failed cells, and its decoding performance is therefore improved. Further alternatively, the MSP may skip the locations marked as erase-failed when programming and reading the block.

The storage configurations and modifications described above are chosen purely by way of example. In alternative embodiments, the MSP may modify, based on the identified erase-failed cells, any other suitable kind of storage configuration that is used for storing data in the cells. As noted above, identification of the erase-failed cells may be carried out by the MSP or by circuitry residing in the memory device itself.

In some embodiments, the MSP determines whether or not to modify the storage configuration based on the number or distribution of the erase-failed cells. For example, if the number of erase-failed cells is sufficiently small, the ECC used by the MSP may be sufficient to correct any errors caused by these cells, without a need to use additional means. Thus, the MSP may refrain from modifying the storage configuration if the number of erase-failed cells is within the correction capabilities of the ECC. Typically, ECC is applied per page. Therefore, the MSP may count or estimate the number of erase-failed cells per page, and decide whether to modify the storage configuration accordingly. In some embodiments, the MSP identifies the worst-performing page (or group of pages), i.e., the page having the maximum number of erase failures. Methods of this sort are described, for example, in FIGS. 4, 5 and 8 further below.

FIG. 3 is a flow chart that schematically illustrates a method for storing data in a memory block having erase-failed memory cells, in accordance with an embodiment of the present invention. The method begins with the MSP defining a default storage configuration, at a default configuration step 70. The MSP checks whether the memory device reported erase failure of a given block, at a failure checking step 74. If the memory device did not report erase failure of the block, the MSP stores data in the block using the default storage configuration, at a data storage step 78.

If, on the other hand, the memory device reported that erasure of the block has failed, the MSP (or the memory device) determines the number, locations and/or distribution of the erase-failed cells in the block, at a cell identification step 82. The MSP (or memory device) may use any suitable technique for counting or estimating the number, locations and/or distribution of erase-failed cells, such as the methods described herein.

Based on the identified erase-failed cells, the MSP modifies the default storage configuration, at a storage modification step 86. Any suitable modification of storage configuration can be applied, such as the examples given above. The MSP stores data in the block using the modified storage configuration, at data storage step 78.

Efficient Detection of Erase Failure Distribution Among Word Lines

In many practical cases, the success or failure of reading data from the block depends on the maximum number of erase-failed cells per word line. For example, when the data in each word line is encoded separately with an ECC, data decoding is likely to succeed if the number of erase-failed cells in each word line is lower than the error correction capability of the ECC. On the other hand, if the number of erase-failed cells in a certain word line exceeds the error correction capability of the ECC, the data will not be read correctly.

Thus, a situation in which the erase-failed cells are distributed evenly among the different word lines of the array is often preferable over a situation in which the same number of erase-failed cells is concentrated in a small number of word lines. In other words, the appropriate storage configuration (or a decision whether the block is to be considered bad or usable) often depends on the worst-performing word line, i.e., the word line containing the highest number of erase-failed cells.

(Typically, a certain margin is assumed between the permitted number of erase-failed cells and the correction capability of the ECC. For example, if the ECC is able to correct one hundred errors per word line, the maximum permitted number of erase-failures per word line may be set to ten, thus leaving ample error correction resources to mitigate distortion and other error factors.)

In some embodiments, the MSP counts the number of erase failures in each word line in the block exhaustively, so as to determine the worst-performing word line. Then, the MSP matches the storage configuration (or classifies the block as good or bad) according to the number of erase failures found in the worst-performing word line.

Alternatively, the MSP may apply an iterative process that identifies an upper bound on the number of erase failures in the worst-performing word line in a given block. The MSP then matches the storage configuration to the upper bound. In the description that follows, the MSP checks whether the bound on the number of erase-failed cells in the worst-performing word line can be handled by the ECC, and retains or discards the block accordingly. Alternatively, however, the MSP may use the identified upper bound to set the appropriate storage configuration. Although the description that follows refers to word lines and groups of word lines, the method can be applied to individual pages (e.g., when each word line contains multiple pages, each encoded separately with ECC).

The description that follows illustrates an iterative search process for identifying the worst-performing word line or group of word lines. The process has a constrained number of iterations. The process divides the set of word lines into groups, which gradually decrease in size. When permitted a large number of iterations, the process converges to the worst-performing word line. When permitted a smaller number of iterations, the process identifies a worst-performing group of word lines (i.e., a group of word lines of a given size having the largest number of erase-failed cells). The number of word lines in the group decreases gradually with each iteration.

FIG. 4 is a flow chart that schematically illustrates a method for assessing a distribution of erase failures in a memory block, in accordance with an embodiment of the present invention. The method begins with the MSP specifying a maximum permitted number of iterations, at a maximum iteration specification step 90. The MSP initially defines a single word-line group comprising all the word lines in the block, at a group initialization step 94.

The MSP counts the number of erase-failed cells in any new word line group that was created in the previous iteration of the process, at a new group counting step 98. (In the first iteration, the MSP counts the number of erase-failed cells in the initial group initialized at step 94.) The MSP then checks whether the number of erase-failed cells is tolerable for all groups, at an acceptability checking step 102. (Typically, the MSP compares the number of erase-failed cells to a predefined threshold. A number of erase failures that is lower than the threshold is regarded as tolerable, and vice versa.) If the number of erase-failed cells is tolerable for all groups, the MSP classifies the block as a good block, at a success classification step 106.

Otherwise (i.e., if the MSP finds at least one word line group having an intolerable number of erase failures), the MSP checks whether the maximum permitted number of iterations was reached, at a maximum iteration checking step 110. If reached, the MSP classifies the block as bad, at a failure classification step 114.

If the maximum number of iterations was not reached, the MSP divides each of the word line groups whose number of erase failures was found to be intolerable into K smaller groups, at a division step 118. K is typically set to 2, although any other suitable value can also be used. The method then loops back to step 98 above, and the MSP counts the number of erase failures in the newly created groups and continues the iterative process.

In some cases, the iterative search process terminates before converging to the single worst-performing word line. In these cases, the process identifies the worst-performing group of word lines and determines the number of erase failures in that group. This number can serve as an upper bound on the maximum number of errors per word line.

The number of erase failures that can be verified using this process depends on a number of factors, such as the maximum permitted number of iterations, the distribution of erase failures among the word lines and the strategy of searching for these errors (e.g., depth first, breadth first, as well as the value of K). In the best case, number of verification steps needed for validating block with F·T erase failures is F (wherein F denotes an arbitrary factor and T denotes the predefined upper threshold on the acceptable erase failures per word line). In the worst case, $F \cdot (1+\text{LOG}_K(N/F))$ iterations are needed, with N denoting the number of word lines. In some embodiments, the MSP can adjust the erase verify threshold based on the number of read word lines. In these embodiments, when a small number of word lines is read, the MSP uses a slightly higher erase verify threshold, so as to approximate an erase verify threshold that corresponds to a larger number of word lines.

As noted above, additionally or alternatively to classifying the block as good or bad, the MSP can also use the identified bound on the maximum number of erase failures per word line to match the storage configuration to the actual capability of the ECC. Since the method matches the storage configuration (or the decision to invalidate the block) to the distribution of erase-failures per word line or group of word lines, it is highly accurate in comparison to methods that consider only the total number of erase failures in the block.

The search process of FIG. 4 is highly efficient in identifying the worst-performing word line or group of word lines in a small number of iterations. In alternative embodiments, as noted above, the MSP may determine the worst-performing word line using other techniques, such as by exhaustively counting the number of erase failures per word line. The description above refers to the method of FIG. 4 as being carried out by the MSP. Alternatively, however, the method can also be carried out by circuitry residing in the memory device.

Identifying Erase Failures in Selected Word Lines Using Word Line Biasing

In each iteration of the search process of FIG. 4 above, some of the word lines in the block are examined for the presence of erase-failed cells, while the other word lines are inhibited. In some embodiments, this word line selection operation can be carried out by applying suitable biasing voltages to the different word lines. Typically, such a biasing scheme uses two biasing voltages denoted RV1 and VPASS, such that word lines that are currently examined for detecting erase failures are biased with RV1, and word lines whose erase failures are to be ignored are biased with VPASS.

Bias voltage RV1 is typically selected to differentiate between the erased level and the first programming level (e.g., by setting RV1=0V). When the gate of a certain cell is biased with RV1, the cell will conduct if it is properly erased, and vice versa. VPASS is typically set above the highest programming level of the cells, so that cells biased with VPASS will conduct regardless of whether they are erased or not.

When the cells along a given column of the memory array are connected to a bit line, the bit line will conduct (i.e., will be read as "1" when sensed) if all the cells that are biased with RV1 are properly erased. If the bit line contains at least one cell, which is biased with RV1 and is not erased properly, the bit line will be read as "0". Thus, this biasing scheme enables the MSP or memory device circuitry to detect erase failures in only a selected subset of the word lines. In particular, when performing each iteration of the search process of FIG. 4, the currently-examined set of word lines is biased with RV1, while the remaining word lines are biased with VPASS.

Figure 5:
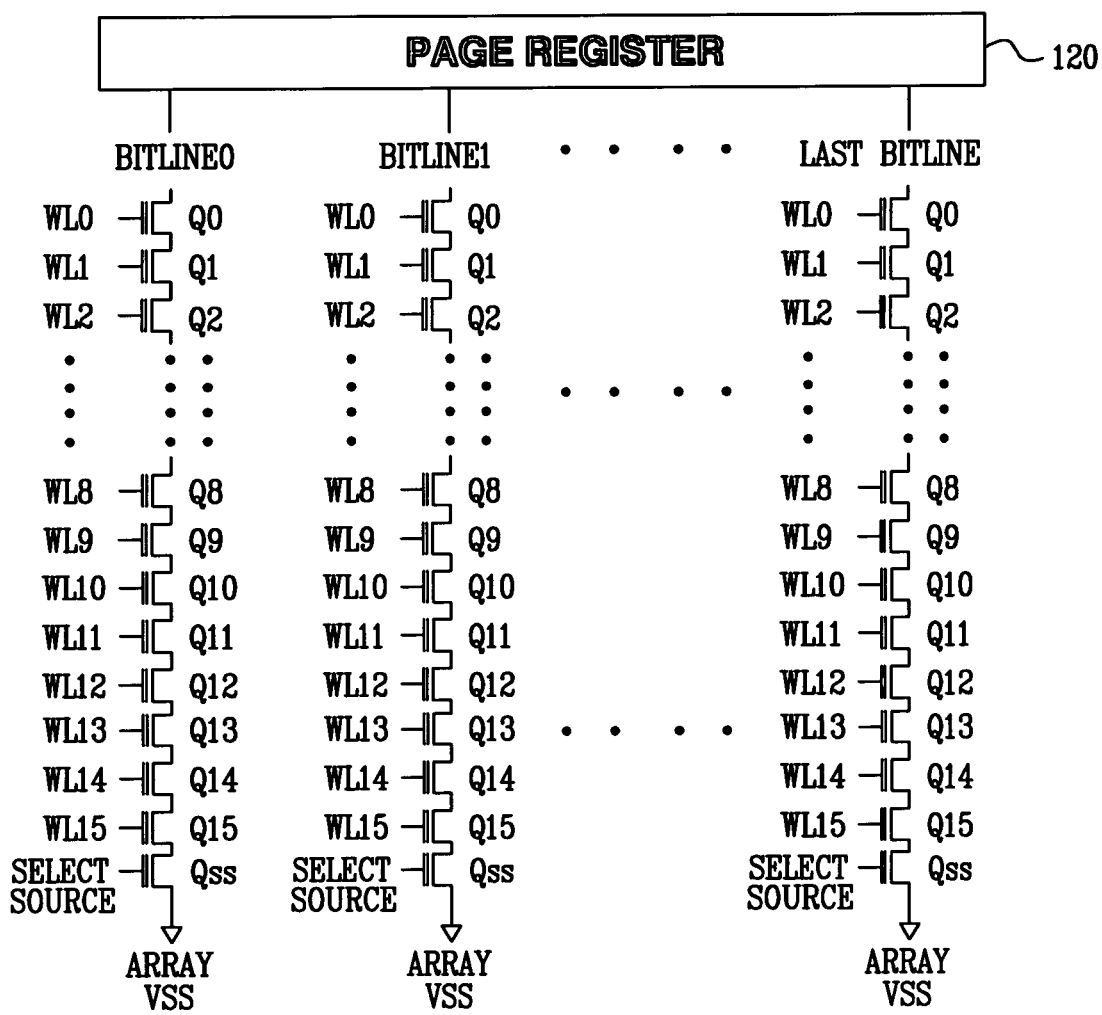
FIG. 5 is a diagram that schematically illustrates a configuration of analog memory cells in word lines and bit lines, in accordance with an embodiment of the present invention.

FIG. 5 is a diagram that schematically illustrates the biasing scheme described above, when it is applied in parallel to a memory array comprising multiple word lines and multiple bit lines, in accordance with an embodiment of the present invention. In this example, multiple wordlines (denoted WL0, WL1 . . . ) are biased in parallel in accordance with the biasing scheme described above. In a given iteration of the search process of FIG. 4, the bit lines are sensed in parallel, and the read results are stored in a page register 120. The page register comprises bits that correspond to the different bit lines. After the read operation of a given search iteration, the pages register will contain all "1"s if all the cells in the word lines that are biased with RV1 are properly erased. In a given bit line, if at least one cell that is biased with RV1 is not erased properly, the corresponding bit in the page register will be "0".

Block Classification Based on the Number of Bit Lines Having Erase-Failed Cells

The contents of page register 120 indicate the number and identity of the bit lines, which have at least one erase-failed cell. As such, the page register can provide the MSP with a rough assessment of the erase failure status of the block. In some embodiments, the MSP classifies the block as good or bad based on this information. For example, the MSP may regard a given block as good if the number of bit lines having erase-failed cells is lower than a certain threshold (denoted TH1), without attempting to determine how the erase failures are distributed among the word lines. The assumption is that the ECC is likely to correct these erase failures. At the other extreme, if the number of bit lines having erase-failed cells is higher than a second threshold (denoted TH2), the MSP may classify the block as bad. This decision is again taken without determining the erase failure distribution among the word lines. The assumption here is that the ECC is likely to fail when the number of erase failures is high.

For intermediate value, i.e., when the number of bit lines having erase-failed cells is between the two thresholds, the MSP examines the block in more detail. The MSP identifies the number, locations and/or distribution of the erase failures in the block, such as using any of the processes described herein. The MSP classifies the block based on the results of the detailed examination. This technique is computationally-efficient, since it performs the detailed (and computationally-intensive) process of assessing the erase failure distribution for only a subset of the blocks.

Figure 6:
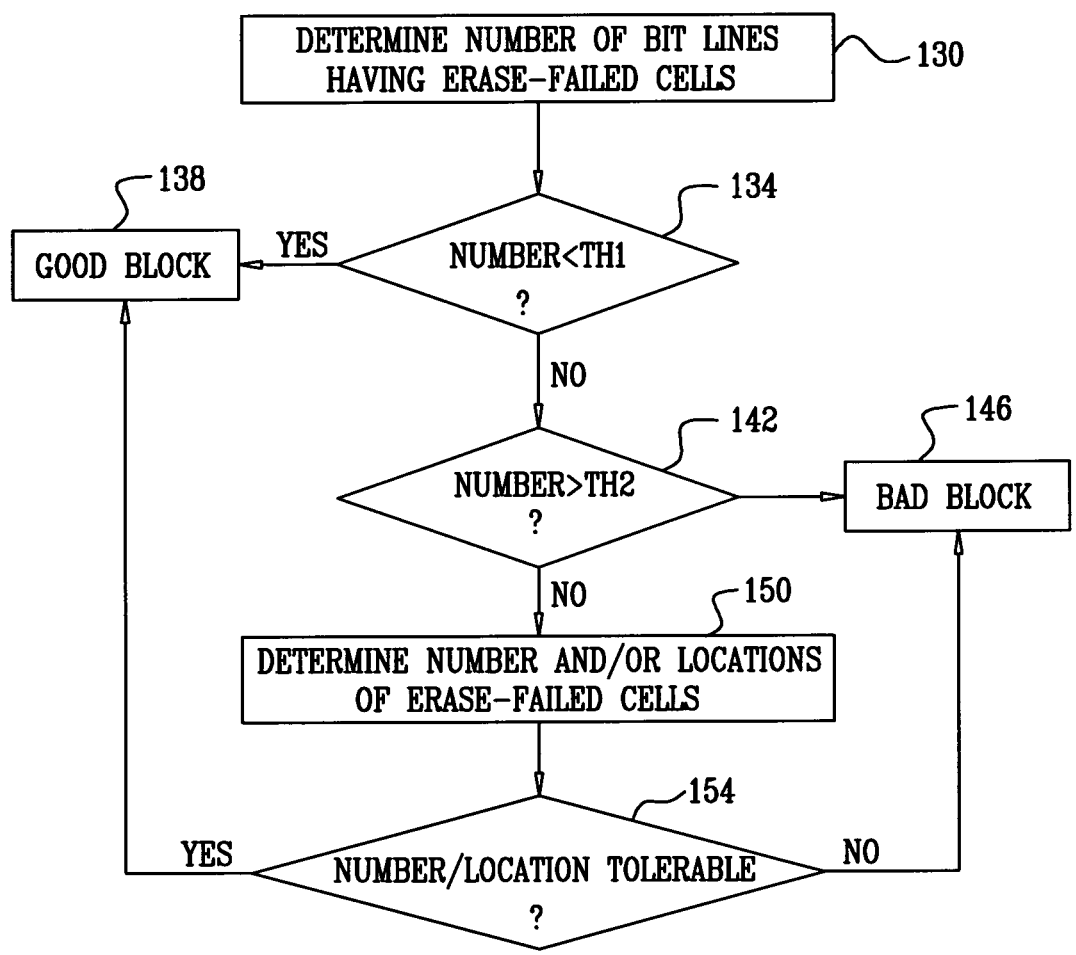
FIG. 6 is a flow chart that schematically illustrates a method for storing data in a memory block having erase-failed memory cells, in accordance with another embodiment of the present invention.

FIG. 6 is a flow chart that schematically illustrates a method for data storage in a memory block having erase-failed memory cells, in accordance with an embodiment of the present invention. The method begins with the MSP determining the number of bit lines in a given block having at least one erase-failed cell, at a bit line counting step 130. For example, the MSP may bias all the word lines with RV1, perform a read operation and count the number of "0"s in page register 120.

The MSP checks whether the number of bit lines having erase-failed cells is smaller than threshold TH1, at a first comparison step 134. If the number of bit lines having erase-failed cells is smaller than TH1, the MSP classifies the block as good, at a good block classification step 138. Otherwise, the MSP checks whether the number of bit lines having erase-failed cells is larger than threshold TH2, at a second comparison step 142. If the number of bit lines having erase-failed cells is larger than TH2, the MSP classifies the block as bad, at a bad block classification step 146.

If the number of bit lines having erase-failed cells is between TH1 and TH2, the MSP determines the number, locations and/or distribution of erase-failed cells in the block, at a distribution evaluation step 150. The MSP checks whether the number, locations and/or distribution of erase failures is tolerable, at an intermediate checking step 154. If tolerable, the MSP classifies the block as good at step 138. Otherwise, the block is classified as bad at step 146.

The number of bit lines having erase failures can be assessed in various ways, and the method of FIG. 6 can use any such technique. For example, the MSP may read the content of page register 120, a process that incurs some communication overhead. Alternatively, R/W unit 36 may comprise N counters that count the number of "0"s in each M bit lines in the block. Each counter has K bits and is clipped to its maximum value in case of overflow. The MSP may read these counters and estimate the number of bit lines having erase failures based on the counter values.

Additionally or alternatively to classifying the block as good or bad, the MSP can use the above-mentioned methods to select an appropriate storage configuration for the block based on the number of bit lines having erase failures.

Block Classification Based on Programming/Erasure History

As noted above, many known memory devices report the success or failure of erasing a given block. In some embodiments of the present invention, the MSP sometimes decides to override (i.e., ignore) this status notification, and continue using a block that has been declared by the memory device as bad. For example, it may be found that most of the bad blocks in a given type of memory device are revealed during the first N Programming/Erasure (P/E) cycles. (N is typically on the order of several tens of thousands, e.g., 20,000 cycles, although any other suitable number can also be used.) The number of new erase failures that occur after the first N P/E cycles is relatively small.

In such a situation, the MSP may disregard erase failure notifications from the memory device for blocks that have gone through a number of P/E cycles that that exceed a predefined threshold (e.g., 20,000). The assumption is that the ECC will be able to correct any additional erase failures that occur after this point.

Although the embodiments described herein mainly address data storage and retrieval in solid-state memory devices, the principles of the present invention can also be used for storing and retrieving data in Hard Disk Drives (HDD) and other data storage media and devices.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage, comprising:
performing an erasure operation on a group of analog memory cells;
identifying as erase-failed cells one or more of the memory cells in the group that failed the erasure operation;
modifying, responsively to the identified erase-failed cells, a storage configuration that is used for programming the analog memory cells in the group; and
storing data within the group of the analog memory cells containing the identified erase-failed cells using the modified storage configuration.

2. The method according to claim 1, wherein storing the data comprises storing a portion of the data in at least one of the erase-failed cells.

3. The method according to claim 1, wherein identifying the erase-failed cells comprises identifying a distribution of locations of the erase-failed cells across the group of the memory cells, and wherein modifying the storage configuration comprises setting the storage configuration responsively to the identified distribution of the locations.

4. The method according to claim 3, wherein the analog memory cells in the group are arranged in an array having multiple cell sub-groups, such that the cells in each of the sub-groups are programmed simultaneously, and wherein identifying the distribution of the locations comprises identifying a worst-performing sub-group containing a maximum number of the erase-failed cells.

5. The method according to claim 4, wherein identifying the worst-performing sub-group comprises applying a sequence of iterations to the multiple sub-groups, such that each iteration retains only a subset of the sub-groups that were retained by a preceding iteration in the sequence by selecting the subgroups having a count of the erase-failed cells that is above a predefined threshold.

6. The method according to claim 5, wherein the analog memory cells are arranged in multiple rows, wherein each sub-group comprises cells that are located in a respective row, and wherein retaining the subset of the sub-groups comprises biasing the rows corresponding to the sub-groups in the subset with a first bias voltage and biasing the rows corresponding to the sub-groups other than the sub-groups in the subset using a second bias voltage that is different from the first bias voltage.

7. The method according to claim 5, wherein applying the sequence of the iterations comprises predefining a maximum permitted number of the iterations, and terminating the sequence upon reaching the maximum permitted number of the iterations.

8. The method according to claim 3 wherein the memory cells are comprised of a NAND Flash device wherein the cells are arranged in multiple NAND strings and wherein the total number of erase-failed cells is approximated by counting the number of NAND strings having at least one erase-failed cell.

9. The method according to claim 1, wherein the analog memory cells are arranged in multiple columns, and wherein modifying the storage configuration comprises setting the storage configuration responsively to a count of the columns containing at least one of the erase-failed cells.

10. The method according to claim 1, wherein identifying the erase-failed cells is performed in response to receiving a notification of a failure of the erasure operation.

11. The method according to claim 1, wherein modifying the storage configuration comprises modifying an Error Correction Code (ECC) that encodes the data in the group of the memory cells.

12. The method according to claim 1, wherein modifying the storage configuration comprises modifying a storage capacity of at least some of the memory cells in the group.

13. The method according to claim 1, wherein modifying the storage configuration comprises modifying a parameter of an iterative Program and Verify (P&V) process that is used for storing the data in the group of the memory cells.

14. The method according to claim 1, wherein modifying the storage configuration comprises setting the storage configuration responsively to a count of programming and erasure cycles applied to the group of the memory cells.

15. The method according to claim 1, wherein identifying the erase-failed cells comprises identifying locations of the erase-failed cells in the group of the memory cells and storing the identified locations, and comprising reading the memory cells in the group and reconstructing the data responsively to the stored locations of the erase-failed cells.

16. The method according to claim 15, wherein storing the data comprises encoding the data with an Error Correction Code (ECC), and wherein reconstructing the data comprises decoding the ECC using an ECC decoding process that accepts erasure indications, and identifying the locations of the erase-failed cells as erasure indications to the ECC decoding process.

17. The method according to claim 15, wherein storing the data and reading the memory cells comprise skipping the identified locations of the erase-failed cells.

18. An apparatus for data storage, comprising:
an interface, which is operative to communicate with a memory device that includes a plurality of analog memory cells; and
circuitry, which is coupled to perform an erasure operation on a group of the analog memory cells, to identify as erase-failed cells one or more of the memory cells in the group that failed the erasure operation, to modify, responsively to the identified erase-failed cells, a storage configuration that is used for programming the analog memory cells in the group, and to store data within the group of the analog memory cells containing the identified erase-failed cells using the modified storage configuration.

19. The apparatus according to claim 18, wherein the circuitry is coupled to store a portion of the data in at least one of the erase-failed cells.

20. The apparatus according to claim 18, wherein the circuitry is coupled to identify a distribution of locations of the erase-failed cells across the group of the memory cells, and to modify the storage configuration responsively to the identified distribution of the locations.

21. The apparatus according to claim 20, wherein the analog memory cells in the group are arranged in an array having multiple cell sub-groups, such that the cells in each of the sub-groups are programmed simultaneously, and wherein the circuitry is coupled to identify a worst-performing sub-group containing a maximum number of the erase-failed cells.

22. The apparatus according to claim 21, wherein the circuitry is coupled to identify the worst-performing sub-group by applying a sequence of iterations to the multiple sub-groups, such that each iteration retains only a subset of the sub-groups that were retained by a preceding iteration in the sequence by selecting the subgroups having a count of the erase-failed cells that is above a predefined threshold.

23. The apparatus according to claim 22, wherein the analog memory cells are arranged in multiple rows, wherein each sub-group comprises cells that are located in a respective row, and wherein the circuitry is coupled to retain the subset of the sub-groups by biasing the rows corresponding to the sub-groups in the subset with a first bias voltage and biasing the rows corresponding to the sub-groups other than the sub-groups in the subset using a second bias voltage that is different from the first bias voltage.

24. The apparatus according to claim 22, wherein the circuitry is coupled to predefine a maximum permitted number of the iterations, and to terminate the sequence upon reaching the maximum permitted number of the iterations.

25. The apparatus according to claim 20, wherein the memory device comprises a NAND Flash device, in which the cells are arranged in multiple NAND strings and wherein the total number of erase-failed cells is approximated by counting the number of NAND strings having at least one erase-failed cell.

26. The apparatus according to claim 18, wherein the analog memory cells are arranged in multiple columns, and wherein the circuitry is coupled to modify the storage configuration responsively to a count of the columns containing at least one of the erase-failed cells.

27. The apparatus according to claim 18, wherein the circuitry is coupled to identify the erase-failed cells responsively to receiving a notification of a failure of the erasure operation.

28. The apparatus according to claim 18, wherein the circuitry is coupled to modify the storage configuration by modifying an Error Correction Code (ECC) that encodes the data in the group of the memory cells.

29. The apparatus according to claim 18, wherein the circuitry is coupled to modify the storage configuration by modifying a storage capacity of at least some of the memory cells in the group.

30. The apparatus according to claim 18, wherein the circuitry is coupled to modify the storage configuration by modifying a parameter of an iterative Program and Verify (P&V) process that is used for storing the data in the group of the memory cells.

31. The apparatus according to claim 18, wherein the circuitry is coupled to modify the storage configuration responsively to a count of programming and erasure cycles applied to the group of the memory cells.

32. The apparatus according to claim 18, wherein the circuitry is coupled to identify locations of the erase-failed cells in the group of the memory cells and storing the identified locations, to read the memory cells in the group and to reconstruct the data responsively to the stored locations of the erase-failed cells.

33. The apparatus according to claim 32, wherein the circuitry is coupled to encode the stored data with an Error Correction Code (ECC), to reconstruct the data by decoding the ECC using an ECC decoding process that accepts erasure indications, and to identify the locations of the erase-failed cells as erasure indications to the ECC decoding process.

34. The apparatus according to claim 32, wherein the circuitry is coupled to skip the identified locations of the erase-failed cells when storing the data and reading the memory cells.

35. The apparatus according to claim 18, wherein the circuitry comprises:
 a Read/Write (R/W) unit, which is packaged in the memory device and is coupled to identify the erase-failed cells and to report information regarding the identified erase-failed cells over the interface; and
 a processor, which is external to the memory device and is coupled to modify the storage configuration responsively to the information reported by the R/W unit.

36. The apparatus according to claim 18, wherein the circuitry comprises a processor that is external to the memory device.

37. Apparatus for data storage, comprising:
 a memory device, which comprises a plurality of analog memory cells; and
 a processor, which is coupled to perform an erasure operation on a group of the analog memory cells, to identify as erase-failed cells one or more of the memory cells in the group that failed the erasure operation, to modify, responsively to the identified erase-failed cells, a storage configuration that is used for programming the analog memory cells, and to store data within the group of the analog memory cells containing the identified erase-failed cells using the modified storage configuration.

38. A memory device, comprising:
 a plurality of analog memory cells; and
 Read/Write (R/W) circuitry, which is coupled to perform an erasure operation on a group of the analog memory cells, to identify as erase-failed one or more of the memory cells in the group that failed the erasure operation, and to report information regarding the identified erase-failed cells to a controller external to the memory device, so as to enable the controller to store data within the group of the analog memory cells containing the identified erase-failed cells.

* * * * *